United States Patent
Minemura et al.

(10) Patent No.: US 9,042,158 B2
(45) Date of Patent: May 26, 2015

(54) NONVOLATILE SEMICONDUCTOR MEMORY DEVICE WITH PROTECTIVE RESISTANCE FILM

(71) Applicant: Kabushiki Kaisha Toshiba, Minato-ku (JP)

(72) Inventors: Yoichi Minemura, Yokkaichi (JP); Takayuki Tsukamoto, Yokkaichi (JP); Takamasa Okawa, Yokkaichi (JP); Hiroshi Kanno, Yokkaichi (JP); Atsushi Yoshida, Yokkaichi (JP); Satoshi Konagai, Mie-gun (JP); Nobuaki Yasutake, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/023,844

(22) Filed: Sep. 11, 2013

(65) Prior Publication Data

US 2014/0347911 A1    Nov. 27, 2014

Related U.S. Application Data

(60) Provisional application No. 61/825,572, filed on May 21, 2013.

(51) Int. Cl.
*G11C 11/00* (2006.01)
*G11C 13/00* (2006.01)

(52) U.S. Cl.
CPC .................................. *G11C 13/0002* (2013.01)

(58) Field of Classification Search
USPC ............................................. 365/148, 230.03
See application file for complete search history.

(56) References Cited

U.S. PATENT DOCUMENTS

| | | | |
|---|---|---|---|
| 8,058,636 B2 | 11/2011 | Osano | |
| 8,071,969 B2 | 12/2011 | Aoyama | |
| 8,227,788 B2 | 7/2012 | Mikawa | |
| 8,410,467 B2 | 4/2013 | Wada | |
| 2008/0191196 A1* | 8/2008 | Lu et al. | 257/27 |
| 2009/0250678 A1* | 10/2009 | Osano et al. | 257/2 |
| 2011/0037043 A1* | 2/2011 | Wada | 257/2 |
| 2012/0280199 A1 | 11/2012 | Takagi | |
| 2013/0221315 A1* | 8/2013 | Wang et al. | 257/4 |
| 2013/0313509 A1* | 11/2013 | Chiang | 257/4 |

FOREIGN PATENT DOCUMENTS

| | | |
|---|---|---|
| JP | 2011-40613 A | 2/2011 |
| WO | WO 2008/126365 | 10/2008 |
| WO | WO 2010/058569 | 5/2010 |
| WO | WO 2011/064967 | 6/2011 |

* cited by examiner

*Primary Examiner* — Hoai V Ho
(74) *Attorney, Agent, or Firm* — Oblon, McClelland, Maier & Neustadt, L.L.P.

(57) ABSTRACT

A nonvolatile semiconductor memory device according to an embodiment includes a memory cell block that includes a memory cell array, the memory cell array including: a plurality of first lines; a plurality of second lines intersecting the plurality of first lines; and a memory cell that is provided at each of intersections of the plurality of first lines and the plurality of second lines and includes a variable resistance element, the memory cell array further including a protective resistance film that is provided respectively at each of the intersections of the plurality of first lines and the plurality of second lines and that is connected in series with the memory cell and ohmically contacts the memory cell, and the protective resistance film being configured from a material having a resistivity of 1~100 Ω·cm.

16 Claims, 26 Drawing Sheets

Lead-Out Portion

US 9,042,158 B2

NONVOLATILE SEMICONDUCTOR MEMORY DEVICE WITH PROTECTIVE RESISTANCE FILM

CROSS-REFERENCE TO RELATED APPLICATIONS

This application is based upon and claims the benefit of priority from the prior U.S. Provisional Application 61/825,572, filed on May 21, 2013, the entire contents of which are incorporated herein by reference.

BACKGROUND

1. Field

Embodiments of the present invention relate to a nonvolatile semiconductor memory device.

2. Description of the Related Art

A resistance varying type memory using a variable resistance element as a memory cell is proposed as a technology achieving further miniaturization of the memory cell. Known as the variable resistance element are: a phase change element that changes its resistance value by a change between crystalline/amorphous states of a chalcogenide compound; a MRAM element that employs resistance change due to a tunnel magnetoresistive effect; a memory element of polymeric ferroelectric RAM (PFRAM) where the resistance element is formed by a conductive polymer; a ReRAM element that causes resistance change by an electric pulse application; and so on.

The variable resistance element is capable of electrically switching between at least two resistance values, for example, a high-resistance state and a low-resistance state. The variable resistance element is disposed at an intersection of a bit line and a word line that cross each other, and thereby configures a memory cell array. Moreover, in the case of a resistance varying type memory, it is effective to add a protective resistance film to the variable resistance element in order to suppress current flowing in the variable resistance element during a setting operation or a resetting operation.

DETAILED DESCRIPTION

A nonvolatile semiconductor memory device according to an embodiment comprises a memory cell block that includes a memory cell array, the memory cell array including: a plurality of first lines; a plurality of second lines intersecting the plurality of first lines; and a memory cell that is provided at each of intersections of the plurality of first lines and the plurality of second lines and includes a variable resistance element, the memory cell array further including a protective resistance film that is provided respectively at each of the intersections of the plurality of first lines and the plurality of second lines and that is connected in series with the memory cell and ohmically contacts the memory cell, and the protective resistance film being configured from a material having a resistivity of 1~100 Ω·cm.

A nonvolatile semiconductor memory device according to embodiments is described below with reference to the drawings.

First Embodiment

First, an overall configuration of a nonvolatile semiconductor memory device according to a first embodiment is described. This nonvolatile semiconductor memory device comprises a memory cell block 1 configured having one or more memory cell arrays MA stacked therein. Each memory cell array MA includes a plurality of memory cells MC disposed in a matrix, and a plurality of bit lines BL and a plurality of word lines WL that select these plurality of memory cells MC.

Electrically connected to the bit line BL of the memory cell block 1 is a column control circuit 2 that controls the bit line BL and enables data erase of the memory cell MC, data write to the memory cell MC, and data read from the memory cell MC. Moreover, electrically connected to the word line WL of the memory cell block 1 is a row control circuit 3 that selects the word line WL and enables data erase of the memory cell MC, data write to the memory cell MC, and data read from the memory cell MC.

Next, a circuit configuration of the memory cell block 1 is described.

Figure 1:
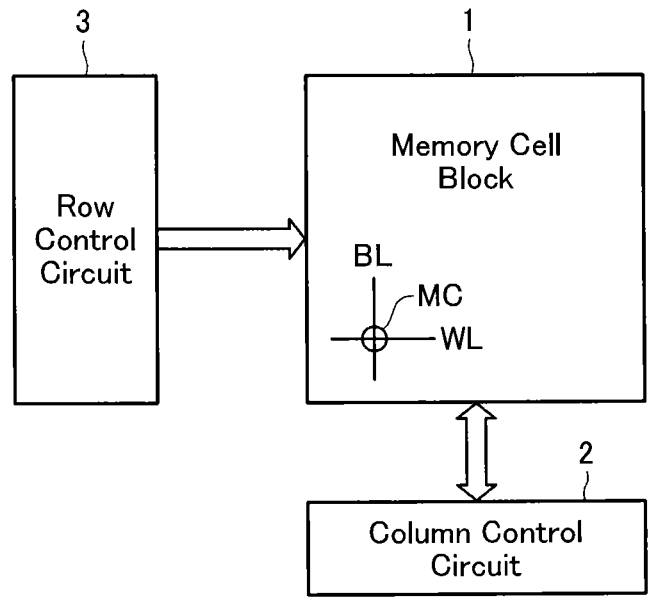
FIG. 1 is an example of a block diagram showing a configuration of a nonvolatile semiconductor memory device according to a first embodiment.
Figure 2:
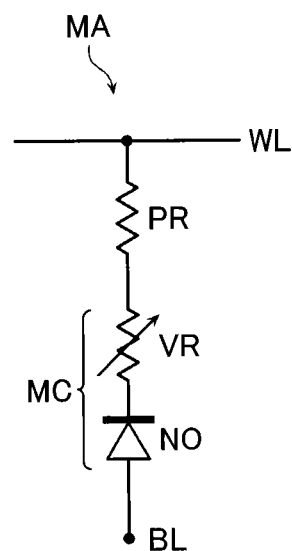
FIG. 2 is an example of an equivalent circuit diagram of part of a memory cell block in the nonvolatile semiconductor memory device according to the same embodiment.

FIG. 2 is an example of an equivalent circuit diagram of part of the memory cell block in the nonvolatile semiconductor memory device according to the present embodiment.

Each memory cell array MA of the memory cell block 1 includes the plurality of bit lines BL extending in a column direction and the plurality of word lines WL extending in a row direction and intersecting these plurality of bit lines BL. In addition, the memory cell array MA includes the memory cell MC provided at each of the intersections of the plurality of bit lines BL and the plurality of word lines WL.

As shown in FIG. 2, the memory cell MC includes a non-ohmic element NO and a variable resistance element VR connected in series. Of these, the non-ohmic element NO is electrically connected to the bit line BL, and the variable resistance element VR is electrically connected to the word line WL via a protective resistance film PR to be described later. That is, the variable resistance element VR and the protective resistance film PR are connected in series. This memory cell MC can be formed by a cross-point structure at the intersection of the bit line BL and the word line WL.

Next, the variable resistance element VR of the memory cell MC is described.

Figure 3:
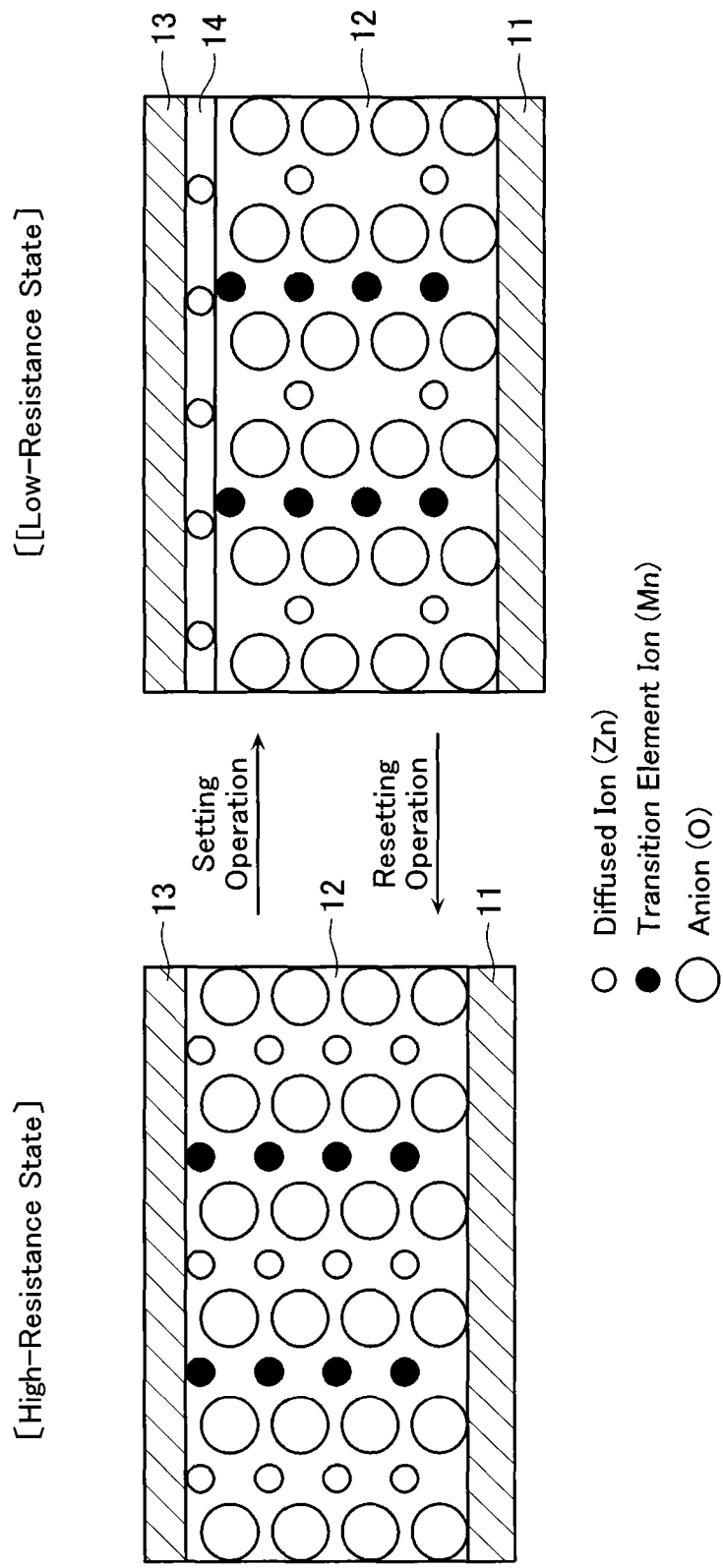
FIG. 3 is an example of a view showing a variable resistance element in the nonvolatile semiconductor memory device according to the same embodiment.

FIG. 3 is an example of a view showing the variable resistance element in the nonvolatile semiconductor memory device according to the present embodiment.

The variable resistance element VR is an element capable of electrically switching between at least two resistance values, for example, a high-resistance state and a low-resistance state. Below, a high-resistance state is also sometimes called a "reset state", a low-resistance state is also sometimes called a "set state", an operation that sets the variable resistance element VR in a low-resistance state to a high-resistance state is also sometimes called a "programming operation", an operation where the variable resistance element VR in a low-resistance state attains a high-resistance state is also sometimes called a "resetting operation", an operation that sets the variable resistance element VR in a high-resistance state to a low-resistance state is also sometimes called an "erase operation", and an operation where the variable resistance element VR in a high-resistance state attains a low-resistance state is also sometimes called a "setting operation". In addition, the programming operation and the erase operation are also sometimes referred to collectively as an "access operation".

The example shown in FIG. 3 is an example of a ReRAM element which is one variable resistance element VR.

This ReRAM element is configured having a recording layer 12 disposed between electrode layers 11 and 13. The recording layer 12 is configured from a composite compound including at least two types of cation elements. At least one of the cation elements is a transition element having a d-orbit incompletely filled with electrons, and a shortest distance between adjacent cation elements is 0.32 nm or less. Specifically, it is represented by a chemical formula $A_xM_yX_z$ (A and M are different elements) and is configured by a material having a crystalline structure such as a spinel structure ($AM_2O_4$), an ilmenite structure ($AMO_3$), a delafossite structure ($AMO_2$), a $LimoN_2$ structure ($AMN_2$), a wolframite structure ($AMO_4$) an olivine structure ($A_2MO_4$), a hollandite structure ($A_xMO_2$) a ramsdellite structure ($A_xMO_2$), and a perovskite structure ($AMO_3$).

In the example of FIG. 3, A comprises Zn, M comprises Mn, and X comprises O. In the recording layer 12 of FIG. 3, a small white circle represents a diffused ion (Zn), a large white circle represents an anion (O), and a small black circle represents a transition element ion (Mn). An initial state of the recording layer 12 is a reset state, but the setting operation on the ReRAM element in this reset state may be performed by setting the electrode layer 11 to a fixed potential and applying a negative voltage to an electrode layer 13 side. In this case, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase a valence of the transition element ion in the recording layer 12. As a result, carrier injection brings the recording layer 12 into electron conduction and thus completes the setting operation. Reproduction (a read operation) may be performed by passing a current that has a very small value of a degree that prevents occurrence of a change in resistance of the material configuring the recording layer 12. The resetting operation on the ReRAM element in a set state may be performed by, for example, passing a large current through the recording layer 12 for a sufficient time, thereby causing Joule heating to facilitate an oxidation reduction reaction in the recording layer 12. Application of an electric field in the opposite direction to that during setting may also allow the resetting operation to be performed.

Next, the non-ohmic element NO of the memory cell MC is described.

The non-ohmic element NO is configured from the likes of polysilicon or silicon-germanium, and is configured from, for example, various kinds of diodes such as a Schottky diode, a PN junction diode, and a PIN diode, a MIM (Metal-Insulator-Metal) structure, a SIS (Silicon-Insulator-Silicon) structure, and so on. An electrode forming a barrier metal layer and an adhesive layer may also be inserted here. The following may be employed as a material of the electrode, namely Pt, Au, Ag, TiAlN, SrRuO, Ru, RuN, Ir, Co, Ti, TiN, TaN, LaNiO, Al, $PtIrO_x$, $PtRhO_x$, Rh/TaAlN, or the like. Moreover, in terms of characteristics of the above-mentioned diodes and structures, using a diode enables a unipolar operation to be performed, and using a SIS structure, a MIM structure, or the like, enables a bipolar operation to be performed. Note that placement of the non-ohmic element NO and the variable resistance element VR may be configured reversely in an up-and-down direction to that in FIG. 2, and a polarity of the non-ohmic element NO may be inverted in an up-and-down direction.

Next, the access operation on the memory cell array MA of the memory cell block 1 is described.

Figure 4:
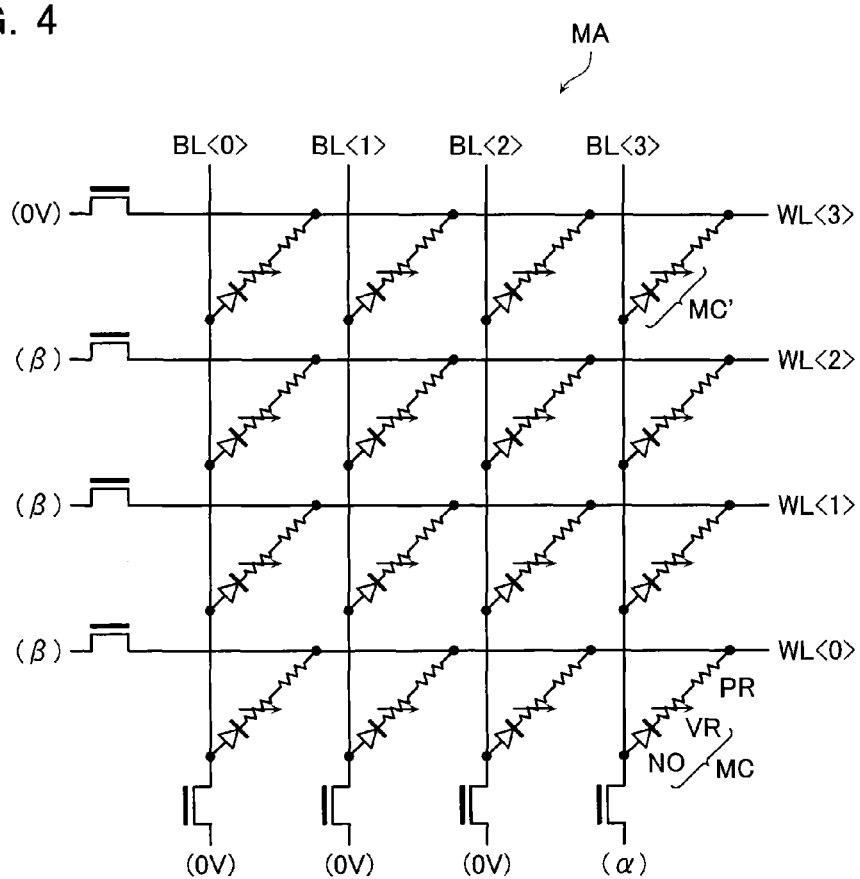
FIG. 4 is an example of a view showing a bias state of a memory cell array during an access operation in the nonvolatile semiconductor memory device according to the same embodiment.
Figure 5:
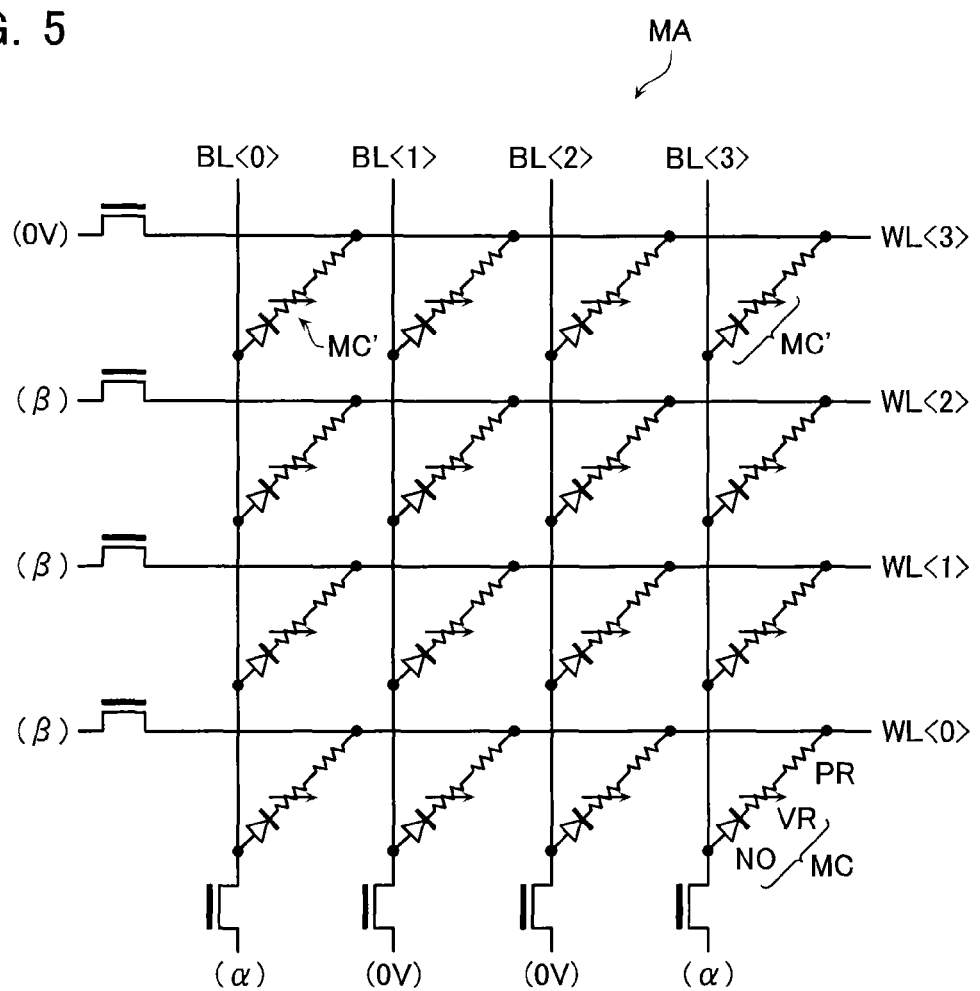
FIG. 5 is an example of a view showing a bias state of the memory cell array during the access operation in the nonvolatile semiconductor memory device according to the same embodiment.

FIGS. 4 and 5 are examples of views showing a bias state of the memory cell array during the access operation in the nonvolatile semiconductor memory device according to the present embodiment.

FIG. 4 shows the case of accessing one memory cell MC. Now, the bit line BL<3> is assumed to be a selected bit line, the word line WL<3> is assumed to be a selected word line, and the memory cell MC' provided at the intersection of the bit line BL<3> and the word line WL<3> is assumed to be a selected memory cell.

When accessing the selected memory cell MC', the selected bit line BL<3> is set to a certain potential α, the other unselected bit lines BL<0>~BL<2> are set to, for example, 0 V, the selected word line WL<3> is set to, for example, 0 V, and the other unselected word lines WL<0>~WL<2> are set to a certain potential β. Now, the potential α is a potential, with reference to 0 V, required for the access operation, and the potential β is a potential, with reference to 0 V, at which the variable resistance element VR does not undergo the setting operation or the resetting operation. In this case, the selected memory cell MC' is basically applied with a forward bias of a voltage α, and as a result the variable resistance element VR undergoes the setting operation or the resetting operation. The unselected memory cells MC at each of the intersections of the selected bit line BL<3> and the unselected word lines WL<0>~WL<2> are applied with a reverse bias, but a size of the reverse bias is only a voltage α-β at which the variable resistance element VR does not undergo the setting operation or the resetting operation, hence a resistance state of the variable resistance element VR does not undergo transition. The unselected memory cells MC at the intersections of the unselected bit lines BL<0>~BL<2> and the selected word line WL<3> are only applied with a voltage 0 V, hence a resistance state of the variable resistance element VR does not undergo transition. In addition, the unselected memory cells MC at the intersections of the unselected bit lines BL<0>~BL<2> and the unselected word lines WL<0>~WL<2> are applied with a reverse bias, but a size of the reverse bias is only a voltage β at which the variable resistance element VR does not undergo the setting operation or the resetting operation, hence a resistance state of the variable resistance element VR does not undergo transition. In other words, setting the memory cell array MA with the bias state shown in FIG. 4 allows the access operation to be performed only on the selected memory cell MC'.

FIG. 5 shows the case of simultaneously accessing a plurality of the memory cells MC. Now, the bit lines BL<0> and BL<3> are assumed to be selected bit lines, the word line WL<3> is assumed to be a selected word line, and the two memory cells MC' provided at each of the intersections of the selected bit lines BL<0> and BL<3> and the selected word line WL<3> are assumed to be selected memory cells.

In this case too, similarly to when accessing one selected memory cell MC', the selected bit lines BL<0> and BL<3> are preferably set to a certain potential α, the other unselected bit lines BL<1> and BL<2> are preferably set to, for example, 0 V, the selected word line WL<3> is preferably set to, for example, 0 V, and the other unselected word lines WL<0>~WL<2> are preferably set to a certain potential β. This allows the two selected memory cells MC' to be simultaneously accessed.

Simultaneously accessing a plurality of the memory cells MC in this way enables speeding-up of the access operation to be achieved. However, when the number of memory cells MC simultaneously accessed increases, an operation current required for the access operation naturally also increases. Therefore, in order to increase the number of memory cells MC simultaneously accessed, it is important to make the operation current small. Moreover, in terms of reducing power consumption, it is important to achieve a reduction in the operation current, even when the number of memory cells MC simultaneously accessed is few.

Accordingly, there is a technology serving as one effective technology for reducing the operation current during the access operation, in which a protective resistance film PR that ohmically contacts the memory cell MC and is in series with the memory cell MC is introduced to the memory cell array MA.

Figure 6:
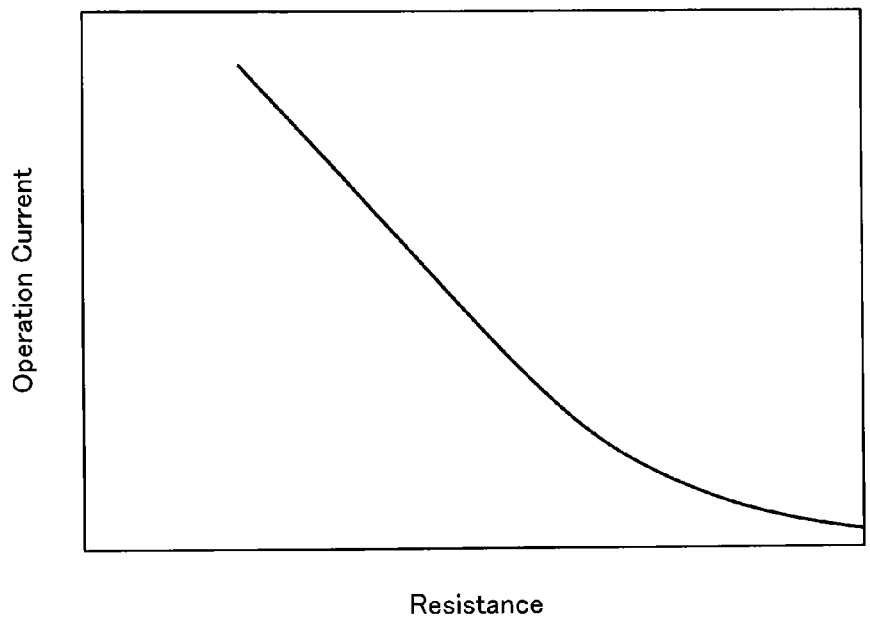
FIG. 6 is an example of a graph showing a relationship between a resistance value of a protective resistance film and an operation current, during the access operation in the nonvolatile semiconductor memory device according to the same embodiment.
Figure 7:
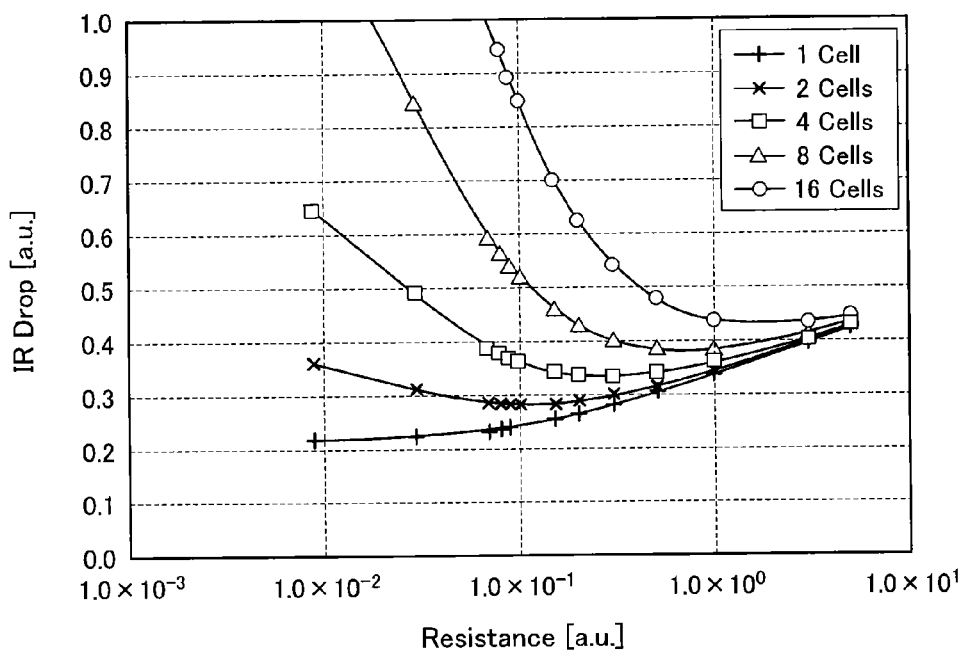
FIG. 7 is an example of a graph showing a relationship between the resistance value of the protective resistance film and a voltage drop due to a resistance component, during the access operation in the nonvolatile semiconductor memory device according to the same embodiment.

Action of the protective resistance film PR connected in series to the memory cell MC is described here using FIGS. 6 and 7.

FIG. 6 is an example of a graph showing a relationship between a resistance value of the protective resistance film and an operation current, during the access operation in the nonvolatile semiconductor memory device according to the present embodiment. Moreover, FIG. 7 is an example of a graph showing a relationship between the resistance value of the protective resistance film and a voltage drop due to a resistance component, during the access operation in the nonvolatile semiconductor memory device according to the present embodiment. The five graphs shown in FIG. 7 show simulation results in the cases where the number of simultaneously accessed memory cells is one (1 cell), two (2 cells), four (4 cells), eight (8 cells), and 16 (16 cells).

As may be understood clearly from the graph shown in FIG. 6, the higher the resistance value of the protective resistance film PR becomes, the smaller the operation current becomes. This is thought to be because connecting the protective resistance film PR to the memory cell MC in series causes the resistance component of the memory cell MC to be increased, with the result that the operation current is reduced and an operation voltage rises.

However, if consideration is given to the voltage drop due to the resistance component shown in FIG. 7, it is not better to introduce a large protective resistance film PR in any case. If the voltage drop due to the resistance component is large, a potential difference applied to the memory cell MC is reduced, leading to an increased possibility that resistance change of the memory cell MC does not occur. When accessing one memory cell MC, the voltage drop, although not very large, has a substantially monotonic increasing tendency. On the other hand, when simultaneously accessing a plurality of the memory cells MC, the operation current flows into a line commonly connected to the plurality of memory cells MC (in the case of FIG. 5, word line WL<3>), via said plurality of memory cells MC. Therefore, as a result of a balance of the voltage drop due to said line and the voltage drop due to the protective resistance film PR, the voltage drop due to the resistance component shows an extreme value with respect to the resistance value of the protective resistance film PR. Thus, in order to perform the access operation in a vicinity of such an extreme value of the voltage drop due to the resistance component, the number of simultaneously accessed memory cells MC is taken into account and a protective resistance film PR having an appropriate resistance value with a resistivity of about 1~100 Ω·cm is introduced.

Next, a structure of the memory cell block 1 is described.

Figure 8:
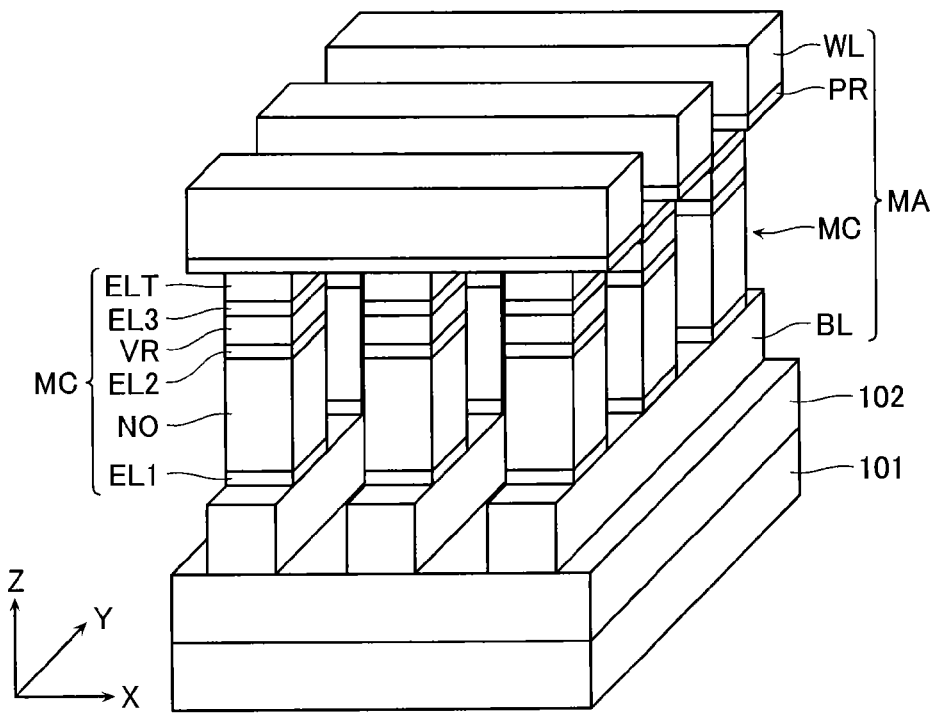
FIG. 8 is an example of a perspective view showing part of the memory cell block in the nonvolatile semiconductor memory device according to the same embodiment.

FIG. 8 is an example of a perspective view showing part of the memory cell block in the nonvolatile semiconductor memory device according to the present embodiment. Note that in FIG. 8, the row direction is assumed to be an X direction, the column direction is assumed to be a Y direction, and a stacking direction of the memory cell block orthogonal to the row direction and the column direction is assumed to be a Z direction. The same applies to other drawings employed hereafter.

The memory cell block 1 according to the present embodiment includes a semiconductor substrate 101 and an inter-layer insulating layer 102 formed on this semiconductor substrate 101 and configured from the likes of $SiO_2$. Note that formed in the semiconductor substrate 101 are an impurity diffusion layer and a gate electrode of a transistor configuring a peripheral circuit not illustrated.

In addition, the memory cell block 1 includes the memory cell array MA. The memory cell array MA includes the plurality of bit lines BL (first lines) formed on the inter-layer insulating layer 102 and extending in the Y direction (column direction), and the plurality of word lines WL (second lines) formed on these plurality of bit lines BL and extending in the X direction (row direction). The bit line BL and the word line WL are preferably of a material which is high heat-resistant and has a low resistance value. For example, W, WSi, NiSi, CoSi, or the like, may be employed as the material of the bit line BL and the word line WL. A resistivity of the bit line BL and the word line WL is about 0.1~100 μΩ·cm.

At this point, each of the resistance value of the protective resistance film PR, the bit line and word line may be found by measuring a TEG (Test Element Group) in a dicing line. For example, the TEG has elements which a resistances of the protective resistance film, a resistance of the bit line and a resistance of the bit line can be measured independently.

Moreover, the memory cell block 1 includes the memory cell MC which is columnar and provided at each of the intersections of the plurality of bit lines BL and the plurality of word lines WL. The memory cell MC is configured by an electrode EL1, the non-ohmic element NO such as a diode or the like, an electrode EL2, the variable resistance element VR, an electrode EL3, and a top electrode ELT, that are stacked from the bit line BL toward the word line WL. The electrodes EL1~EL3 function as a barrier metal and an adhesive layer and may employ, for example, Pt, Au, Ag, TiAlN, SrRuO, Ru, RuN, Ir, Co, Ti, TiN, TaN, LaNiO, Al, PtIrO$_x$, PtRhO$_x$, Rh/TaAlN, or the like. Moreover, W or the like may be employed as a material of the top electrode ELT.

Furthermore, the memory cell block 1 includes the protective resistance film PR disposed between the top electrode ELT of the memory cell MC and the word line WL and ohmically contacted with the memory cell MC. Selected here as a material of the protective resistance film PR is a material of a kind that non-ohmically contacts the top electrode ELT. In the case of the present embodiment, the protective resistance film PR provided at the intersection of a certain bit line BL and a certain word line WL and the protective resistance film PR provided at the intersection of another bit line BL and said certain word line WL are formed continuously in the X direction in which the word line WL extends. In other words, when the memory cell block 1 is viewed from the Z direction (stacking direction), the protective resistance film PR has a position and shape that match those of the word line WL. The protective resistance film PR may be formed employing a material such as may have a resistivity of about 1~100 Ω·cm in accordance with the number of memory cells MC to be simultaneously accessed, for example, SiN, TaN, TiON, HfN, ZrN, AlN, TiSiN, TaSiN, HfSiN, AlSiN, ZrSiN, TiAlN, TaAlN, doped poly silicon, and so on. Specifically, TaSiN may be said to be an excellent material in terms of linearity of resistance and voltage withstand. Moreover, in the memory cell array MA, the protective resistance film PR exposes only a side surface facing in the Y direction.

Next, a manufacturing process of the memory cell block 1 shown in FIG. 8 is described.

FIGS. 9~13 are examples of perspective views showing manufacturing processes of the memory cell block in the nonvolatile semiconductor memory device according to the present embodiment, in order of process.

Figure 9:
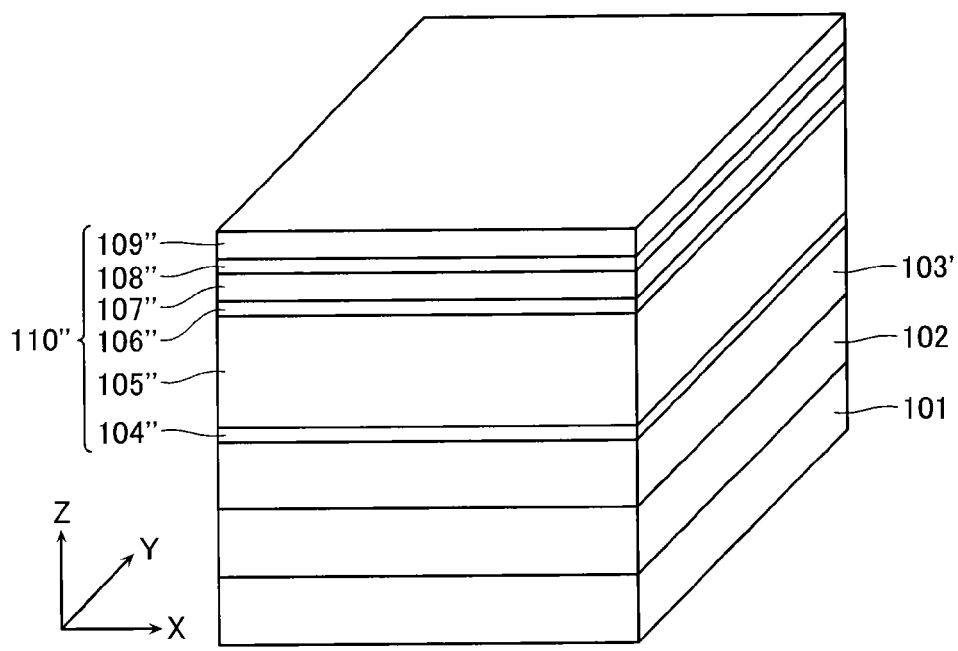
FIGS. 9~13 are examples of perspective views showing manufacturing processes of the memory cell block in the nonvolatile semiconductor memory device according to the same embodiment, in order of process.

First, as shown in FIG. 9, a FEOL (Front End Of Line) process for forming on the semiconductor substrate 101 a transistor, and so on, configuring a required peripheral circuit, is executed, and then the inter-layer insulating layer 102 configured from the likes of $SiO_2$ is deposited on the semiconductor substrate 101. Following this, as shown in FIG. 9, a first line layer 103' which is to become the bit line BL, a layer 104" which is to become the electrode EL1, a layer 105" which is to become the non-ohmic element NO, a layer 106" which is to become the electrode EL2, a layer 107" which is to become the variable resistance element VR, a layer 108" which is to become the electrode EL3, and a layer 109" which is to become the top electrode ELT are deposited sequentially on the inter-layer insulating layer 102. Of these, the layers 104"~109" configure a memory cell layer 110" which is to become the memory cell MC.

Figure 10:
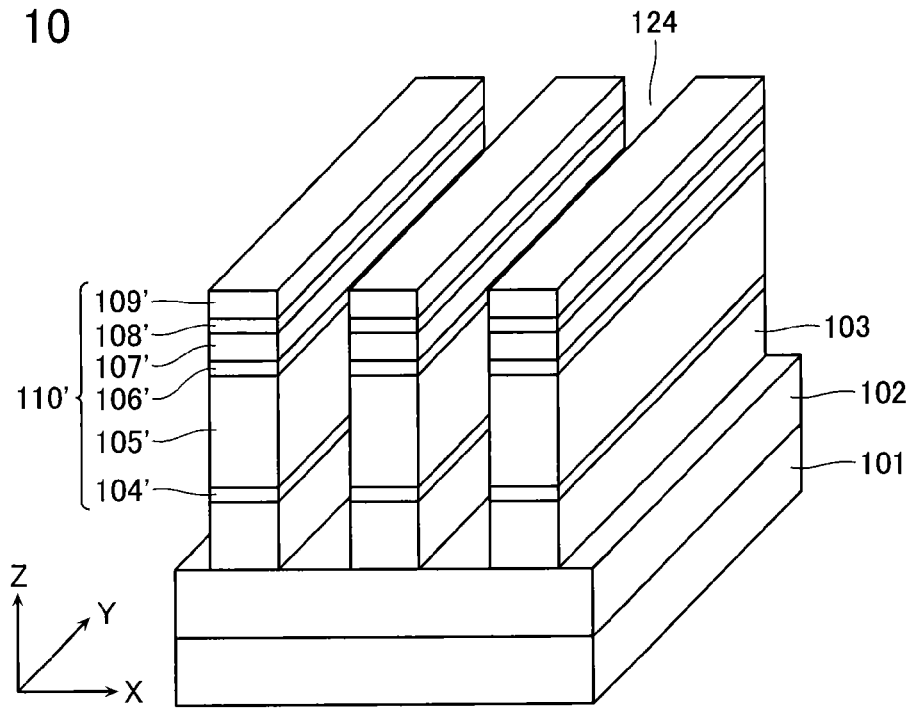

Then, as shown in FIG. 10, a plurality of trenches 124 extending in the Y direction are formed in the memory cell layer 110" and the first line layer 103', using anisotropic etching or the like, until an upper surface of the inter-layer insulating layer 102 is exposed. As a result, the first line layer 103' and the memory cell layer 110' become first line layers 103 and memory cell layers 110' separated in the Y direction. Moreover, the first line layer 103 becomes the bit line BL.

Figure 11:
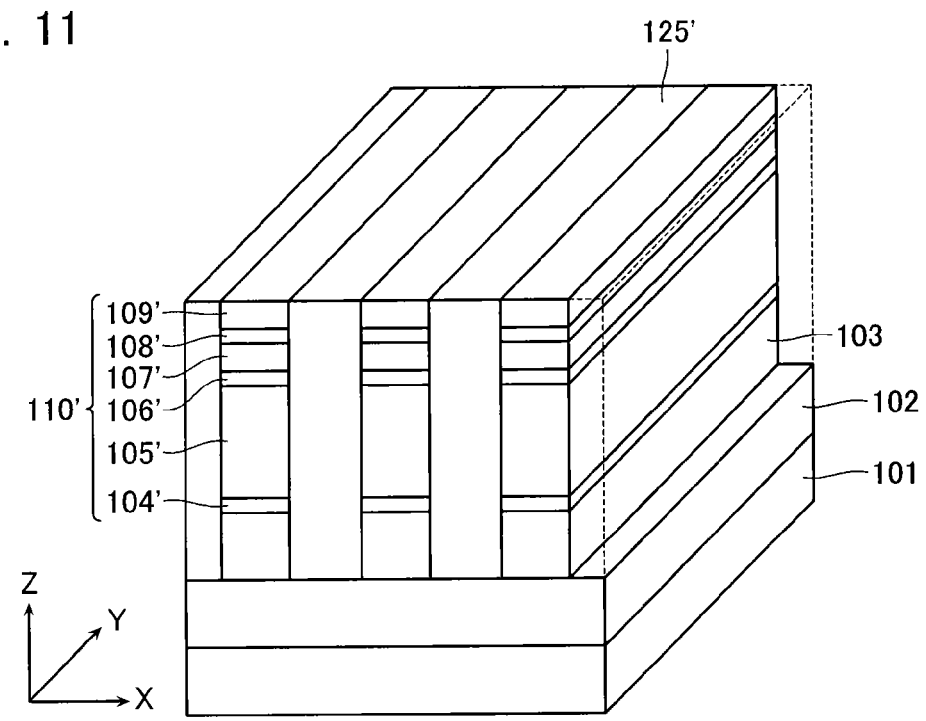

Following this, as shown in FIG. 11, an inter-layer insulating film 125' adopting the likes of $SiO_2$ as its material is filled into the trench 124, and then upper surfaces of the memory cell layer 110' and the inter-layer insulating film 125' are smoothed using CMP (Chemical Mechanical Polishing), or the like.

Figure 12:
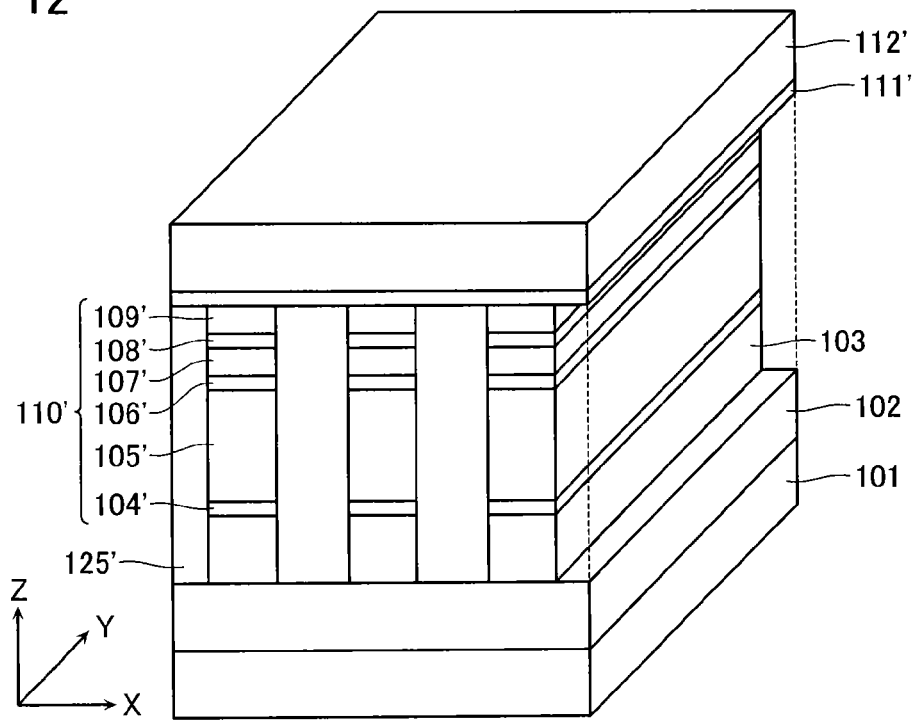

Then, as shown in FIG. 12, a protective resistance layer 111' which is to become the protective resistance film PR and a second line layer 112' which is to become the word line WL are stacked sequentially on the memory cell layer 110' and the inter-layer insulating film 125'.

Figure 13:
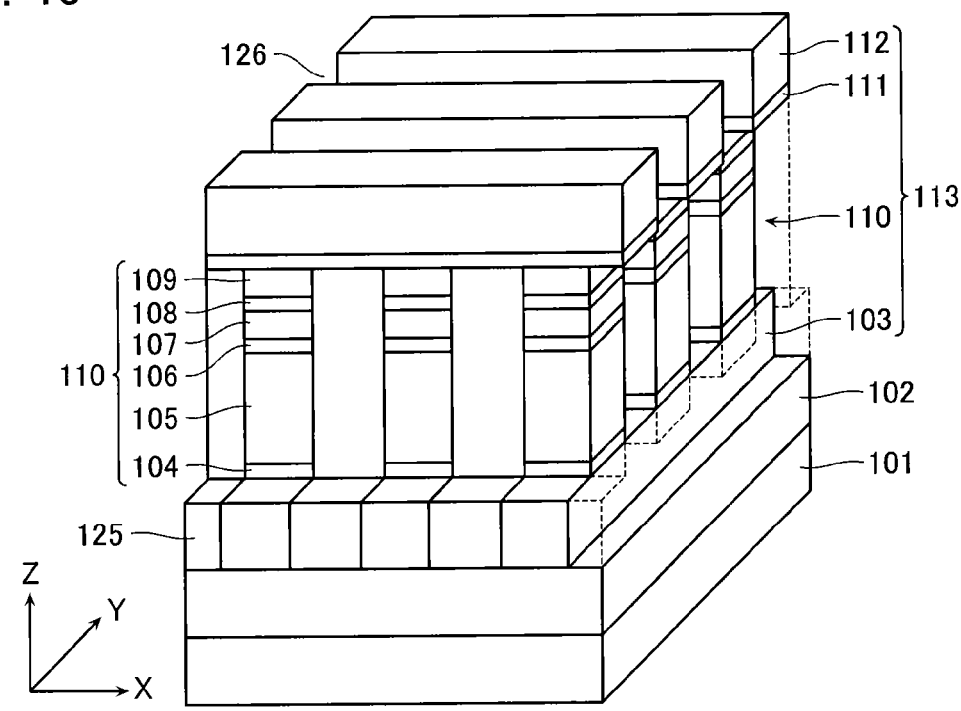

Then, as shown in FIG. 13, a plurality of trenches 126 extending in the X direction are formed in the second line layer 112', the protective resistance layer 111', the inter-layer insulating film 125', and the memory cell layer 110', using anisotropic etching or the like, until an upper surface of the first line layer 103 is exposed. As a result, the memory cell layer 110', the inter-layer insulating film 125', the protective resistance layer 111', and the second line layer 112' become memory cell layers 110, inter-layer insulating films 125, protective resistance layers 111, and second line layers 112 separated in the X direction. Moreover, the memory cell layer 110, the protective resistance layer 111, and the second line layer 112 become the memory cell MC, the protective resistance film PR, and the word line WL. The first line layer 103, the memory cell layer 110, the protective resistance layer 111, and the second line layer 112 configure a memory cell array layer 113 which is the memory cell array MA.

Then, as required, the likes of an inter-layer insulating film adopting $SiO_2$ or the like as its material is filled into the trench 126, thereby allowing the memory cell block 1 shown in FIG. 8 to be manufactured.

Next, advantages of the nonvolatile semiconductor memory device according to the present embodiment are described using a comparative example.

Figure 36:
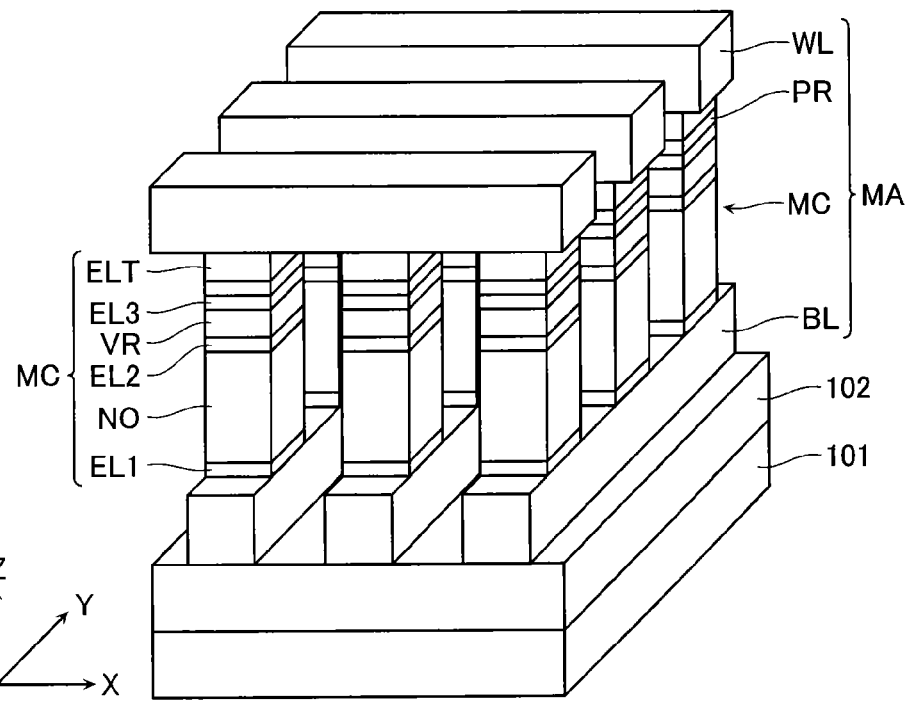
FIG. 36 is an example of a perspective view showing part of a memory cell block in a nonvolatile semiconductor memory device according to a comparative example with respect to the first embodiment.

FIG. 36 is an example of a perspective view showing part of a memory cell block in a nonvolatile semiconductor memory device according to a comparative example with respect to the present embodiment. The memory cell block according to this comparative example differs from the memory cell block 1 according to the present embodiment in having the protective resistance film PR inserted between the electrode EL3 and the top electrode ELT and formed independently with respect to each intersection of the plurality of bit lines BL and the plurality of word lines WL.

When forming the memory cell block according to this comparative example, it is required that, in a process corresponding to the process of forming the trench 124 shown in FIG. 10 of the present embodiment, anisotropic etching with an aspect ratio higher than that in the case of the present embodiment by an amount proportional to the protective resistance layer, is executed. To put it another way, in the case of the present embodiment where the protective resistance layer is stacked after the process shown in FIG. 10, the aspect ratio when forming the trench can be made smaller compared to in the comparative example. In other words, processing of the memory cell block 1 can be performed more easily in the case of the present embodiment than in the case of the comparative example.

In addition, the case of the comparative example results in two times of processing being applied to the protective resistance layer, namely at formation of the trenches extending in the Y direction and formation of the trenches extending in the X direction. Moreover, these two times of processing may cause the protective resistance layer to undergo a change in properties due to oxidation of a sidewall, hence a resistance value of the protective resistance film PR after formation ends up deviating from a design value. In this respect, the case of the present embodiment results in only one time of processing on the protective resistance layer 111', hence a change in properties of the protective resistance layer 111' due to processing can be more greatly reduced than in the case of the comparative example, whereby a protective resistance film PR having a more optimal resistance value can be obtained.

Furthermore, the present embodiment also has the following advantages.

Figure 14:
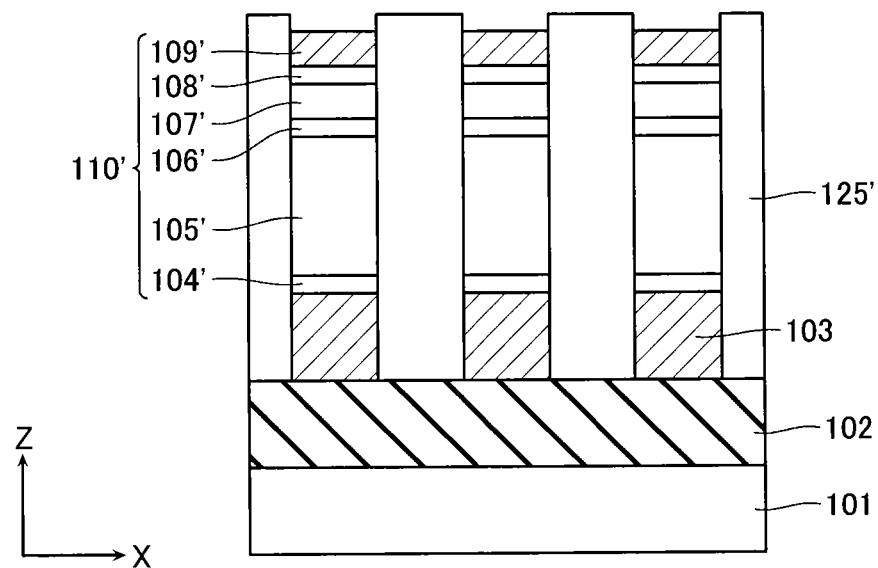
FIGS. 14 and 15 are examples of views explaining the manufacturing process of the memory cell block in the nonvolatile semiconductor memory device according to the same embodiment.
Figure 15:
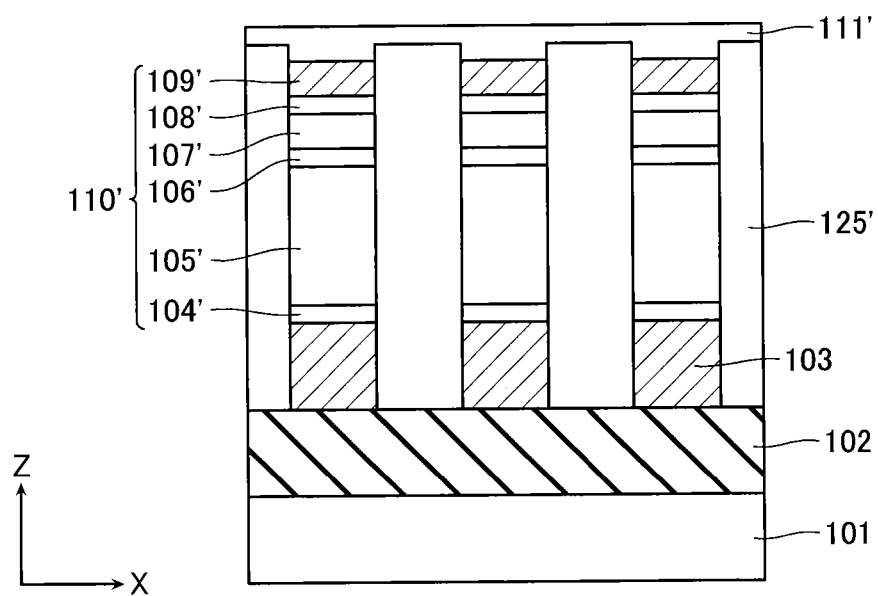

FIGS. 14 and 15 are examples of views explaining the manufacturing process of the memory cell block in the nonvolatile semiconductor memory device according to the present embodiment.

In the process shown in FIG. 11, the upper surfaces of the memory cell layer 110' and the inter-layer insulating film 125' are planarized, but, as shown in FIG. 14, that process sometimes causes a step to be generated by the upper surface of the memory cell layer 110' and the upper surface of the inter-layer insulating film 125'. Regarding this point, as shown in FIG. 15, the present embodiment has the protective resistance layer 111' stacked on the upper surfaces of the memory cell layer 110' and the inter-layer insulating film 125', hence the step generated by the upper surface of the memory cell layer 110' and the upper surface of the inter-layer insulating film 125' can be made small.

Moreover, in the case of a structure where the word line WL is formed directly on the upper surfaces of the memory cell layer (top electrode ELT) and the inter-layer insulating film as in the nonvolatile semiconductor memory device according to the comparative example, because of a difference in orientation of an under-layer of the word line WL, a crystal grain boundary becomes small and a line resistance of the word line WL rises. On the other hand, in the case of the present embodiment, the second line layer 112' which is to become the word line WL is stacked on the memory cell layer 110' and the inter-layer insulating film 125' via the protective resistance layer 111', hence the difference in orientation due to the under-layer is relieved. In other words, a word line WL having better electrical characteristics than those in the case of the comparative example can be formed.

As is clear from the above, the present embodiment makes it possible to provide a nonvolatile semiconductor memory device of low power consumption, and a method of manufacturing the same in which processing of the memory cell block is easy.

Second Embodiment

A nonvolatile semiconductor memory device according to a second embodiment differs from the nonvolatile semiconductor memory device according to the first embodiment in placement of the protective resistance film PR. Mainly, portions that differ from the first embodiment are described here.

Figure 16:
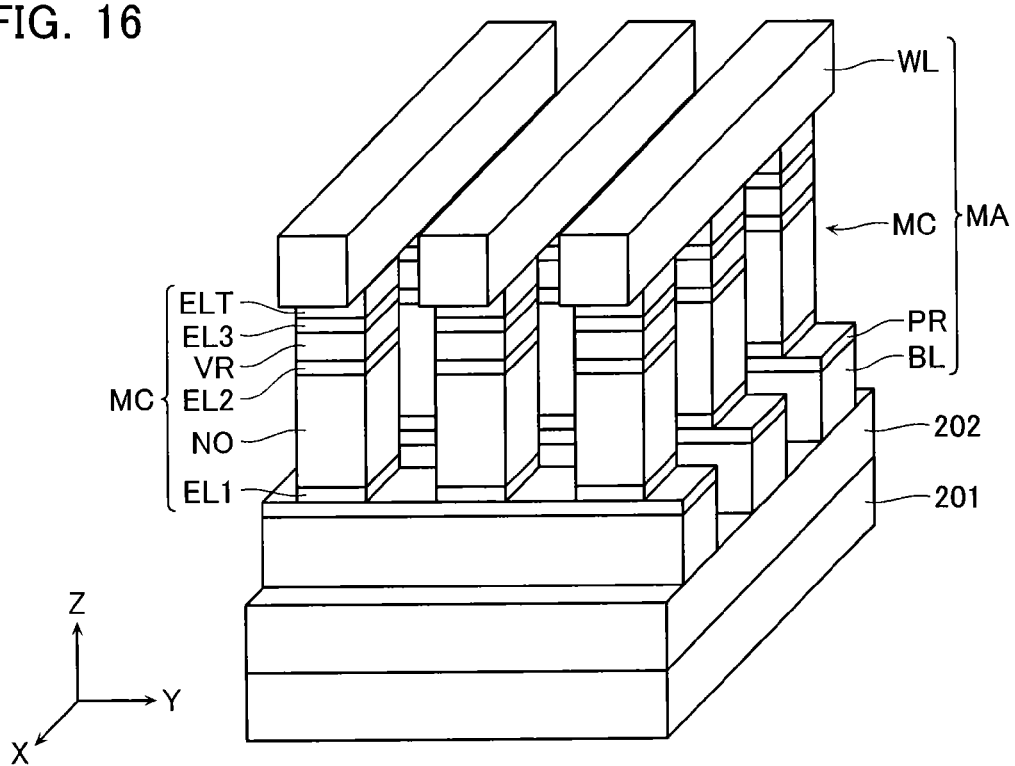
FIG. 16 is an example of a perspective view showing part of a memory cell block in a nonvolatile semiconductor memory device according to a second embodiment.

FIG. 16 is an example of a perspective view showing part of a memory cell block in the nonvolatile semiconductor memory device according to the second embodiment.

Contrary to in the case of the first embodiment, the protective resistance film PR in the memory cell block 1 according to the present embodiment is disposed between the bit line BL and the electrode EL1 of the memory cell MC, ohmically contacted with the memory cell MC. In the case of the present embodiment, the protective resistance film PR provided at the intersection of a certain bit line BL and a certain word line WL and the protective resistance film PR provided at the intersection of said certain bit line BL and another word line WL are formed continuously in the Y direction (column direction) in which the bit line BL extends. In other words, when the memory cell block 1 is viewed from the Z direction (stacking direction), the protective resistance film PR has a position and shape that match those of the bit line BL.

Next, a manufacturing process of the memory cell block 1 shown in FIG. 16 is described.

FIGS. 17~20 are examples of perspective views showing manufacturing processes of the memory cell block in the nonvolatile semiconductor memory device according to the present embodiment, in order of process.

Figure 17:
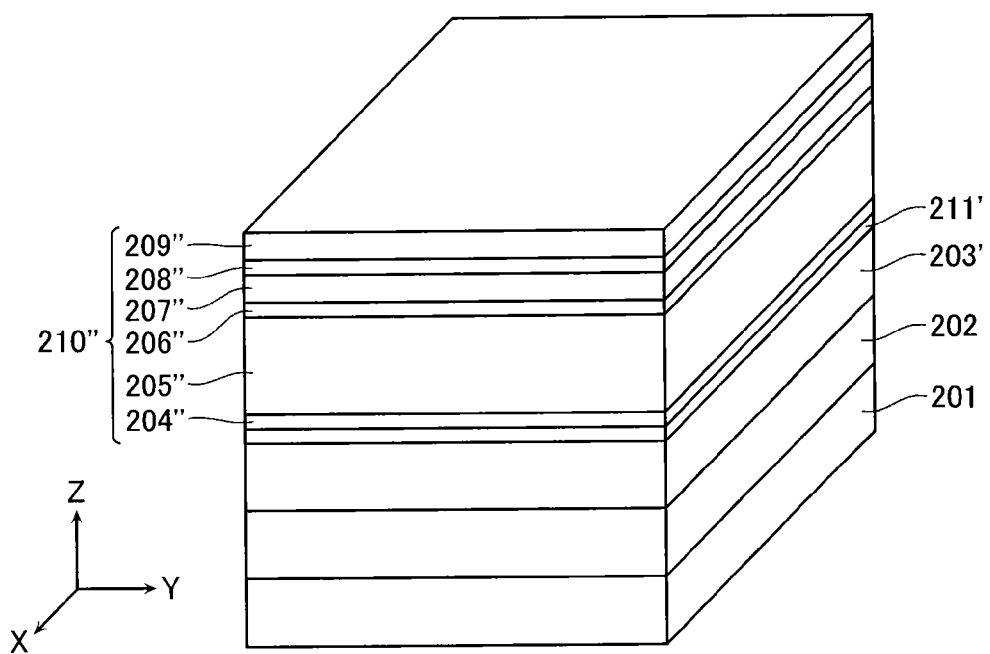
FIGS. 17~20 are examples of perspective views showing manufacturing processes of the memory cell block in the nonvolatile semiconductor memory device according to the same embodiment, in order of process.

First, as shown in FIG. 17, a first line layer 203' which is to become the bit line BL, a protective resistance layer 211' which is to become the protective resistance film PR, a layer 204" which is to become the electrode EL1, a layer 205" which is to become the non-ohmic element NO, a layer 206" which is to become the electrode EL2, a layer 207" which is to become the variable resistance element VR, a layer 208' which is to become the electrode EL3, and a layer 209" which is to become the top electrode ELT are deposited sequentially on an inter-layer insulating layer 202. Of these, the layers 204"~209" configure a memory cell layer 210" which is to become the memory cell MC.

Figure 18:
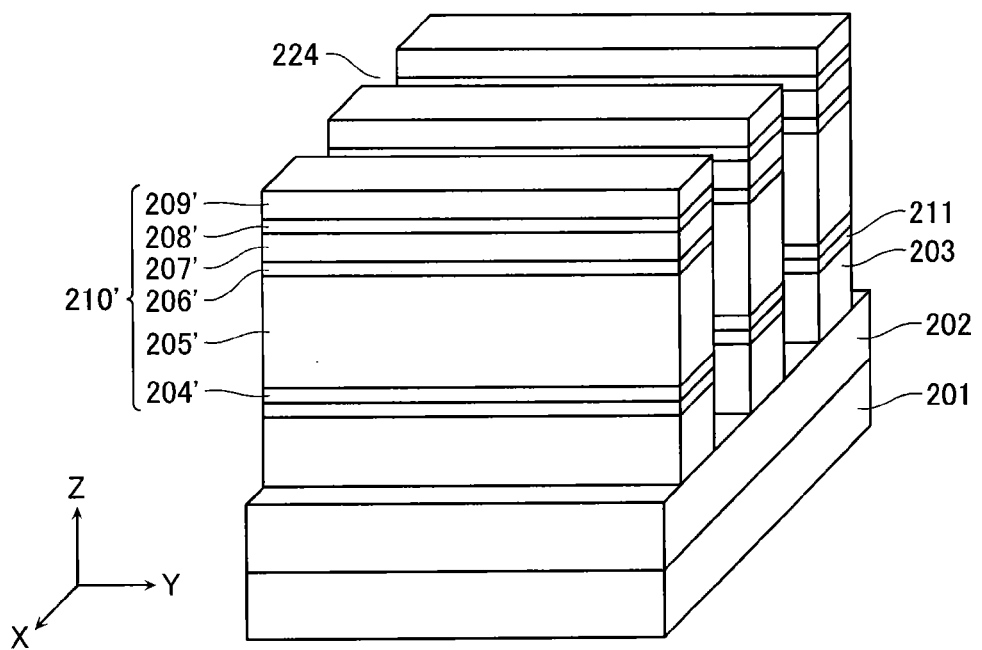

Then, as shown in FIG. 18, a plurality of trenches 224 extending in the Y direction are formed in the memory cell layer 210", the protective resistance layer 211', and the first line layer 203', using anisotropic etching or the like, until an upper surface of the inter-layer insulating layer 202 is exposed. As a result, the first line layer 203', the protective resistance layer 211', and the memory cell layer 210" become first line layers 203, protective resistance layers 211, and memory cell layers 210' separated in the Y direction. Moreover, the first line layer 203 and the protective resistance layer 211 become the bit line BL and the protective resistance film PR.

Figure 19:
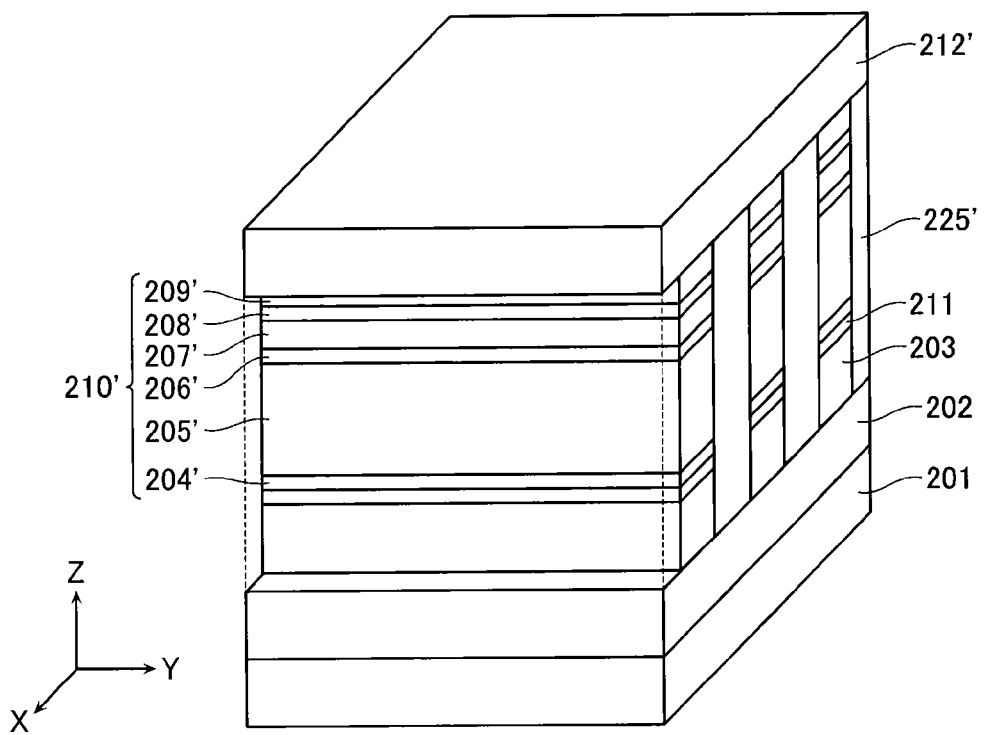

Following this, as shown in FIG. 19, an inter-layer insulating film 225' is filled into the trench 224, and then upper surfaces of the memory cell layer 210' and the inter-layer insulating film 225' are smoothed. Then, a second line layer 212' which is to become the word line WL is stacked sequentially on the memory cell layer 210' and the inter-layer insulating film 225'.

Figure 20:
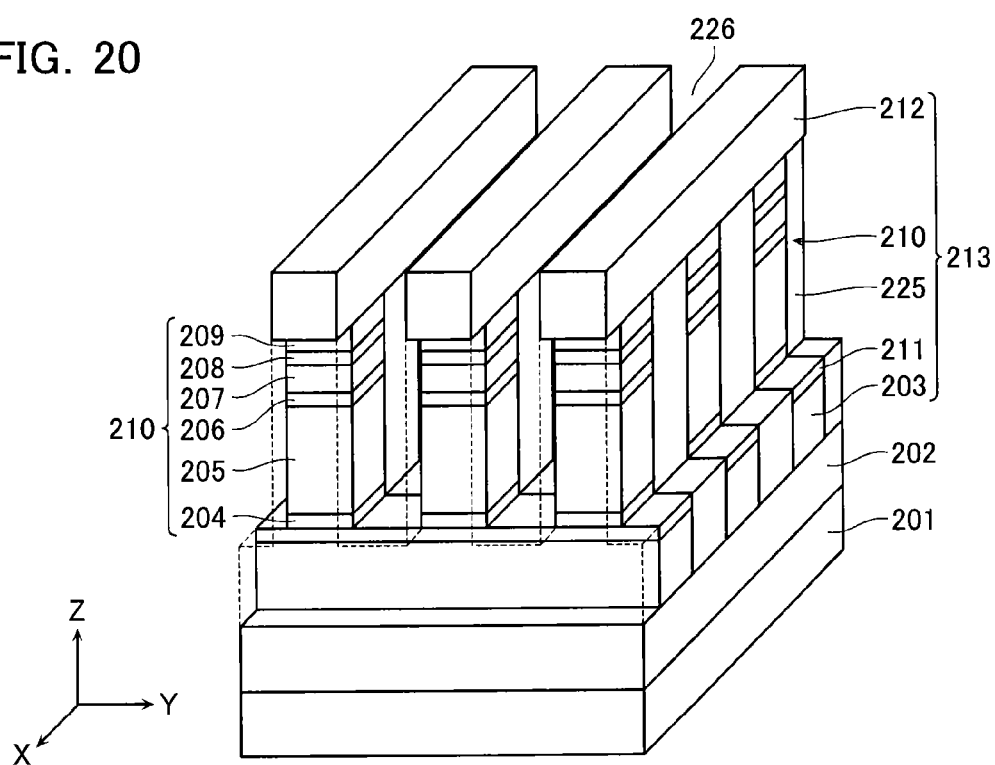

Then, as shown in FIG. 20, a plurality of trenches 226 extending in the X direction (row direction) are formed in the second line layer 212', the inter-layer insulating film 225', and the memory cell layer 210', until an upper surface of the protective resistance layer 211 is exposed. As a result, the memory cell layer 210', the inter-layer insulating film 225', and the second line layer 212' become memory cell layers 210, inter-layer insulating films 225, and second line layers 212 separated in the X direction. Moreover, the memory cell layer 210 and the second line layer 212 become the memory cell MC and the word line WL. The first line layer 203, the protective resistance layer 211, the memory cell layer 210, and the second line layer 212 configure a memory cell array layer 213 which is the memory cell array MA.

Then, as required, the likes of an inter-layer insulating film is filled into the trench 226, thereby allowing the memory cell block 1 shown in FIG. 16 to be manufactured.

Next, advantages of the nonvolatile semiconductor memory device according to the present embodiment are described.

In the case of the present embodiment, only one time of processing needs to be performed on the protective resistance layer 211' in the process of forming the trench 224 shown in FIG. 18. Therefore, similarly to in the first embodiment, not only can the aspect ratio when forming the trench 226 shown in FIG. 20 be made small, but also a change in properties of the protective resistance layer 211' caused by processing can be reduced.

Furthermore, the present embodiment also has the following advantages.

Figure 21:
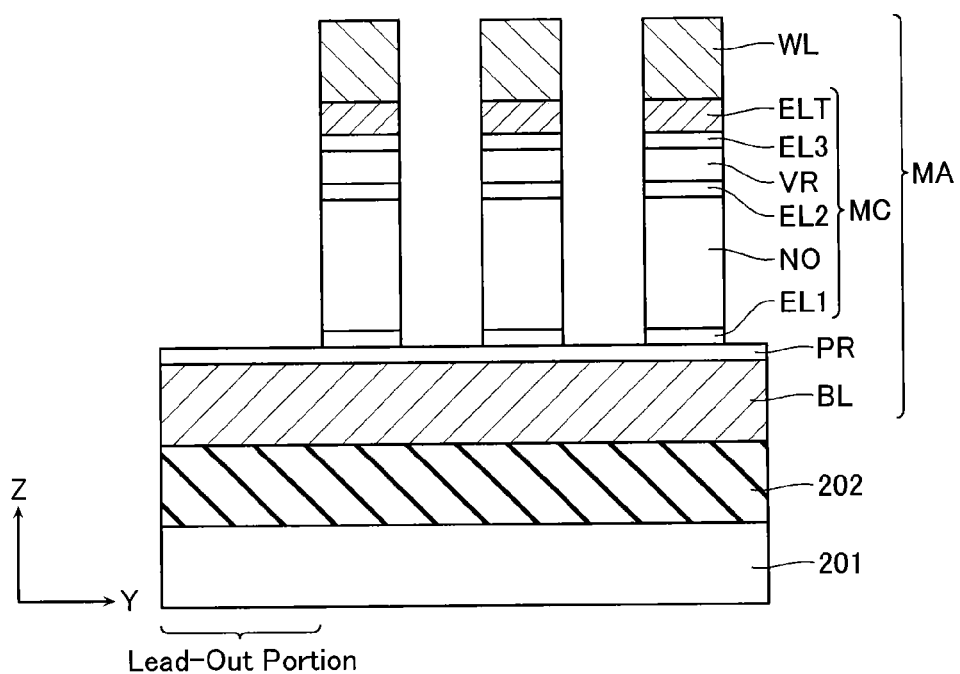
FIGS. 21 and 22 are examples of cross-sectional views explaining a manufacturing process of a hook-up portion of the memory cell block in the nonvolatile semiconductor memory device according to the same embodiment.
Figure 22:
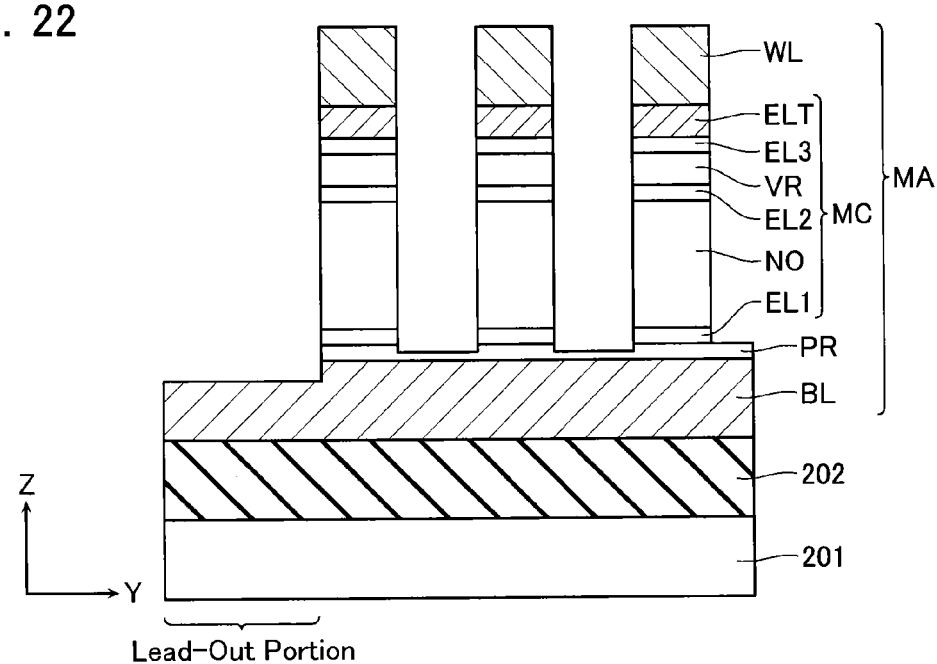

FIGS. 21 and 22 are examples of cross-sectional views of a hook-up portion of the memory cell block in the nonvolatile semiconductor memory device according to the present embodiment. Now, hook-up portion refers to an end portion of the bit line BL or the word line WL positioned outside a placement region of the memory cell MC, where there is no intersection of the bit line BL and the word line WL. This hook-up portion is connected to a peripheral circuit, and so on.

Figure 37:
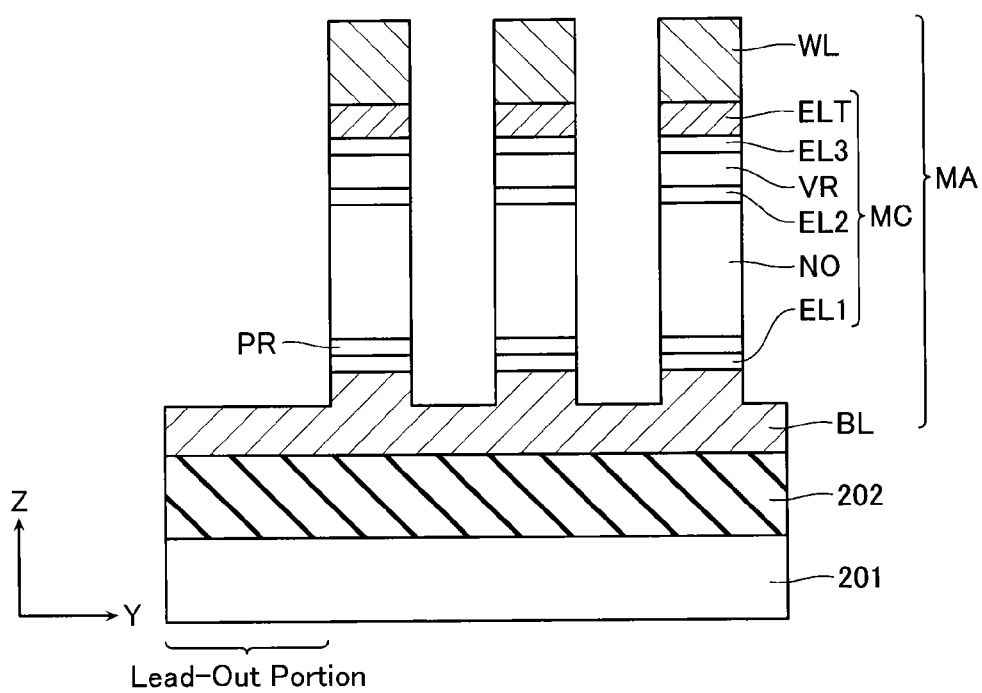
FIG. 37 is an example of a cross-sectional view explaining a manufacturing process of a hook-up portion of a memory cell block in a nonvolatile semiconductor memory device according to a comparative example with respect to the second embodiment.

Moreover, FIG. 37 is an example of a cross-sectional view of a hook-up portion of a memory cell block in a nonvolatile semiconductor memory device according to a comparative example with respect to the present embodiment. In the case of this comparative example, the protective resistance film PR is disposed between the electrode EL1 and the non-ohmic element NO.

In the previously described manufacturing process of the memory cell block 1 shown in FIG. 10, the memory cell layer 110' including the electrode EL1 is separated in the X direction, but, at this time, over-etching is sometimes performed to reliably separate the electrode EL1. In this case, as shown in FIG. 37, according to the comparative example, reduction in film thickness of a line layer (BL) at an end portion of the line layer which is to become the hook-up portion, due to gouging, causes parasitic resistance to rise.

On the other hand, in the case of the present embodiment, the protective resistance film PR has a resistance value which is high, hence there is no need to separate the protective resistance film PR in the X direction. Moreover, the protective resistance layer is stacked on the line layer of the hook-up portion, hence this protective resistance layer functions as an etching protection film during formation of the hook-up portion. As a result, gouging of the line layer can be suppressed and a rise in parasitic resistance can be suppressed, hence the operation voltage during the access operation can be reduced.

Note that in the case shown in FIG. 21, the protective resistance film PR remains in the hook-up portion, but as shown in FIG. 22, the protective resistance film PR in the hook-up portion is also sometimes completely removed by a loading effect. Even in this case, an amount of gouging of the hook-up portion (depth of a step formed in the line layer) can be made smaller than in the case of the comparative example shown in FIG. 37. Moreover, in the case of the present embodiment shown in FIGS. 21 and 22, a depth of the step formed in an upper portion of the line layer between the memory cells MC is less than or equal to a depth of the step formed in an upper portion of the line layer of the hook-up portion.

As is clear from the above, the present embodiment also makes it possible to provide a nonvolatile semiconductor memory device of low power consumption, and a method of manufacturing the same in which processing of the memory cell block is easy.

Third Embodiment

A nonvolatile semiconductor memory device according to a third embodiment differs from the nonvolatile semiconductor memory device according to the first embodiment in comprising a memory cell block 1 having a plurality of memory cell arrays MA stacked therein. Mainly, portions that differ from the first embodiment are described here.

Figure 23:
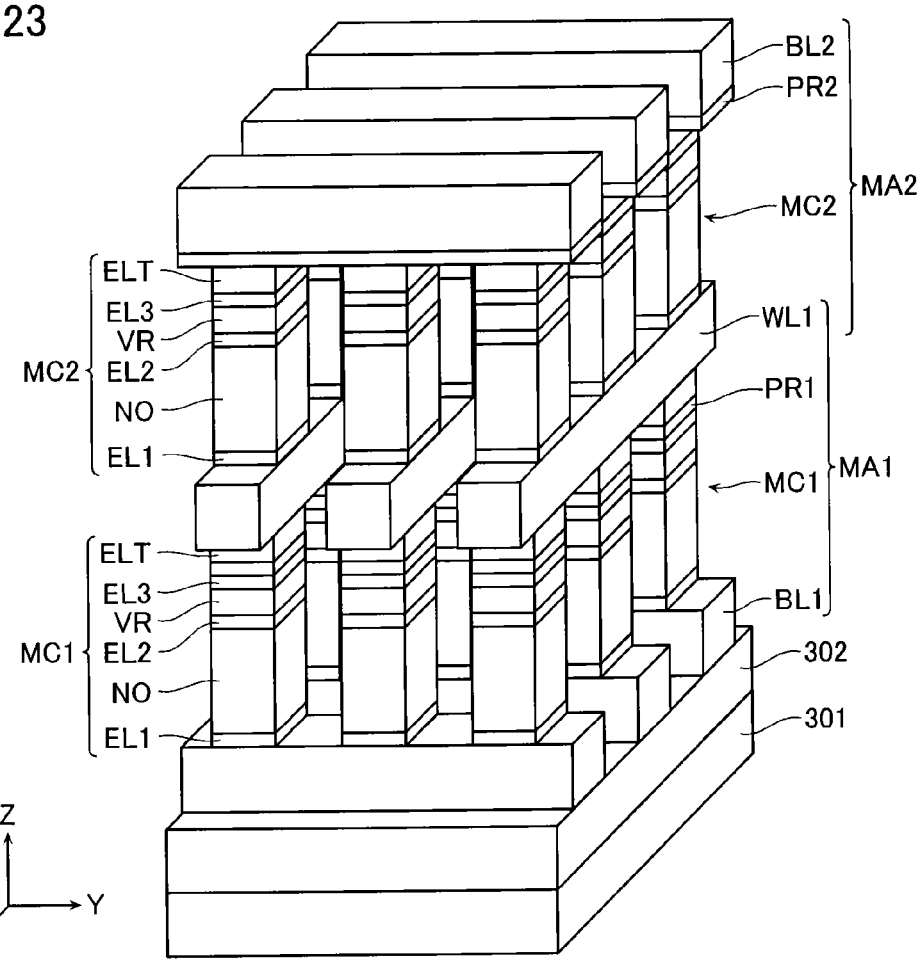
FIGS. 23 and 24 are examples of perspective views showing part of a memory cell block in a nonvolatile semiconductor memory device according to a third embodiment.

FIG. 23 is an example of a perspective view showing part of the memory cell block in the nonvolatile semiconductor memory device according to the third embodiment.

The memory cell block 1 according to the present embodiment includes a memory cell array MA1 which is a lower-side memory cell array and a memory cell array MA2 which is an upper-side memory cell array, that are stacked sequentially on an inter-layer insulating layer 302.

Figure 24:
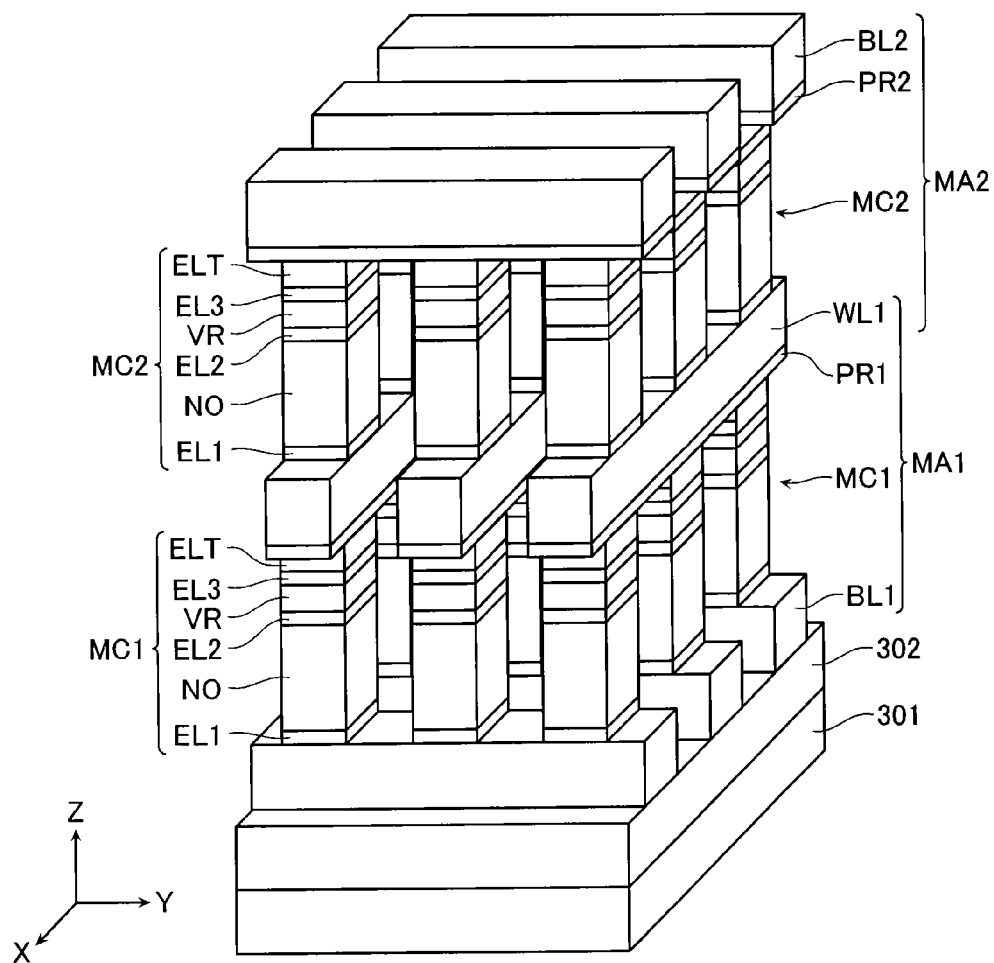

The memory cell array MA1 includes: a bit line BL1 (first line) which is a lower-side line extending in the Y direction (column direction); a word line WL1 (second line) which is an intermediate line; and a memory cell MC1 and protective resistance film PR1 provided at each intersection of the bit line BL1 and the word line WL1. In the case of the memory cell array MA1, similarly to in the case of the comparative example shown in FIG. 36, the protective resistance film PR1 is provided between the electrode EL3 and the top electrode ELT of the memory cell MC1. Note that as shown in FIG. 24, the protective resistance film PR1 may also be provided between the top electrode ELT and the word line WL1, similarly to in the first embodiment.

The memory cell array MA2 includes: the plurality of word lines WL1 shared with the memory cell array MA1; a bit line BL2 (third line) which is an upper-side line extending in the Y direction; a memory cell MC2 provided at each intersection of the plurality of word lines WL1 and the plurality of bit lines BL2; and a protective resistance film PR2. In the case of the memory cell array MA2, similarly to in the case of the first embodiment, the protective resistance film PR2 is disposed between the top electrode ELT of the memory cell MC2 and the bit line BL2, ohmically contacted with the memory cell MC2. Moreover, the protective resistance film PR2 provided at the intersection of a certain word line WL1 and a certain bit line BL2 and the protective resistance film PR2 provided at the intersection of another word line WL1 and said certain bit line BL2 are formed continuously in the Y direction in which the bit line BL2 extends. In other words, in the memory cell array MA, the protective resistance film PR2 exposes only a side surface facing in the X direction (row direction). Note that in the case of a structure shown in FIG. 24, the protective resistance film PR1 exposes only a side surface facing in the Y direction. On the other words, the protective resistance film PR2 directly contacts to the bit line BL2. At this time, "directly contact" means including the protective resistance film contacts to the bit line BL2 via barrier metal or adhesive layer. And it can say that the same thing about the protective resistance film PR2 in FIG. 24.

Next, FIGS. 25~30 are examples of perspective views showing manufacturing processes of the memory cell block in the nonvolatile semiconductor memory device according to the present embodiment, in order of process.

Figure 25:
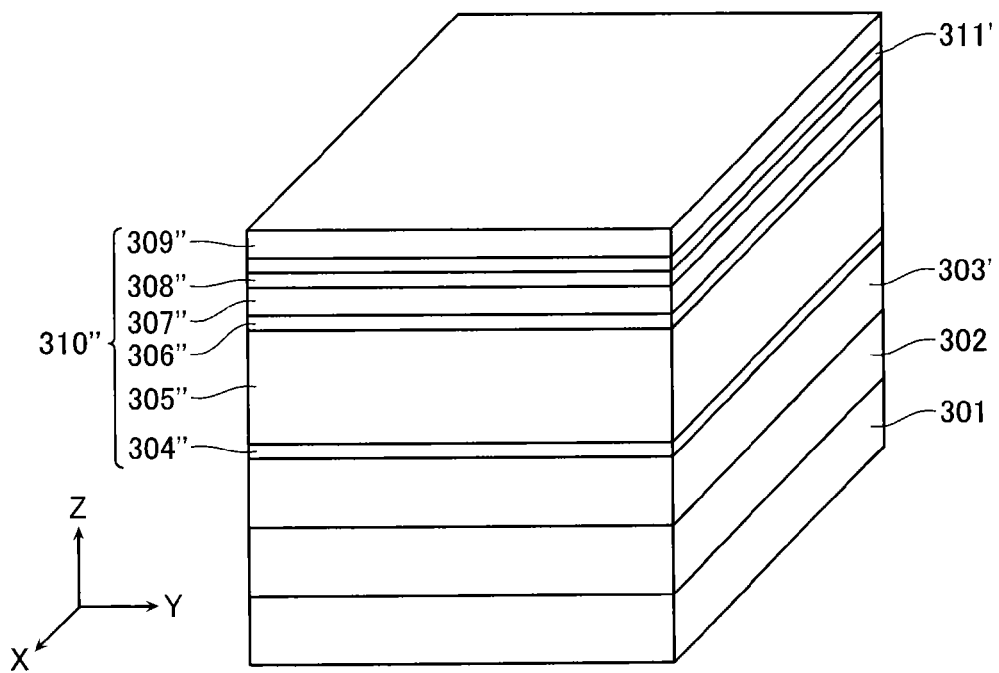
FIGS. 25~30 are examples of perspective views showing manufacturing processes of the memory cell block in the nonvolatile semiconductor memory device according to the same embodiment, in order of process.

First, as shown in FIG. 25, a lower-side line layer 303' which is to become the bit line BL1, a layer 304" which is to become the electrode EL1, a layer 305" which is to become the non-ohmic element NO, a layer 306" which is to become the electrode EL2, a layer 307" which is to become the variable resistance element VR, a layer 308" which is to become the electrode EL3, a lower-side protective resistance layer 311" which is to become the protective resistance film PR, and a layer 309" which is to become the top electrode ELT are deposited sequentially on an inter-layer insulating layer 302. Of these, the layers 304"~309" configure a lower-side memory cell layer 310" which is to become the memory cell MC1.

Figure 26:
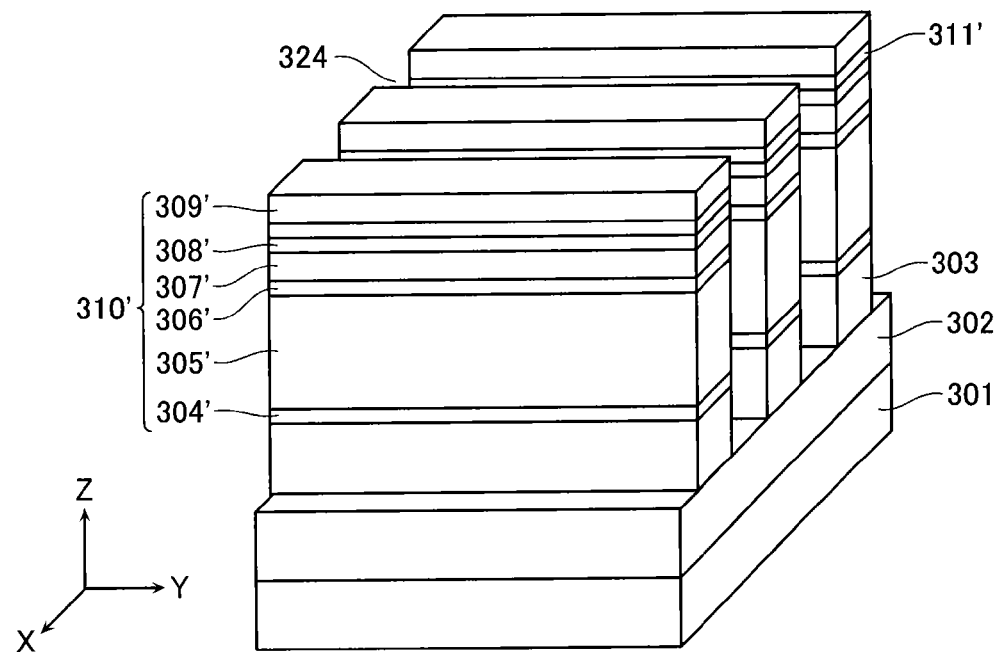

Then, as shown in FIG. 26, a plurality of trenches 324 extending in the Y direction are formed in the lower-side protective resistance layer 311", the lower-side memory cell layer 310", and the lower-side line layer 303', using anisotropic etching or the like, until an upper surface of the inter-layer insulating layer 302 is exposed. As a result, the lower-side line layer 303', the lower-side memory cell layer 310", and the lower-side protective resistance layer 311" become lower-side line layers 303, lower-side memory cell layers 310', and lower-side protective resistance layers 311' separated in the Y direction. Moreover, the lower-side line layer 303 becomes the bit line BL1.

Figure 27:
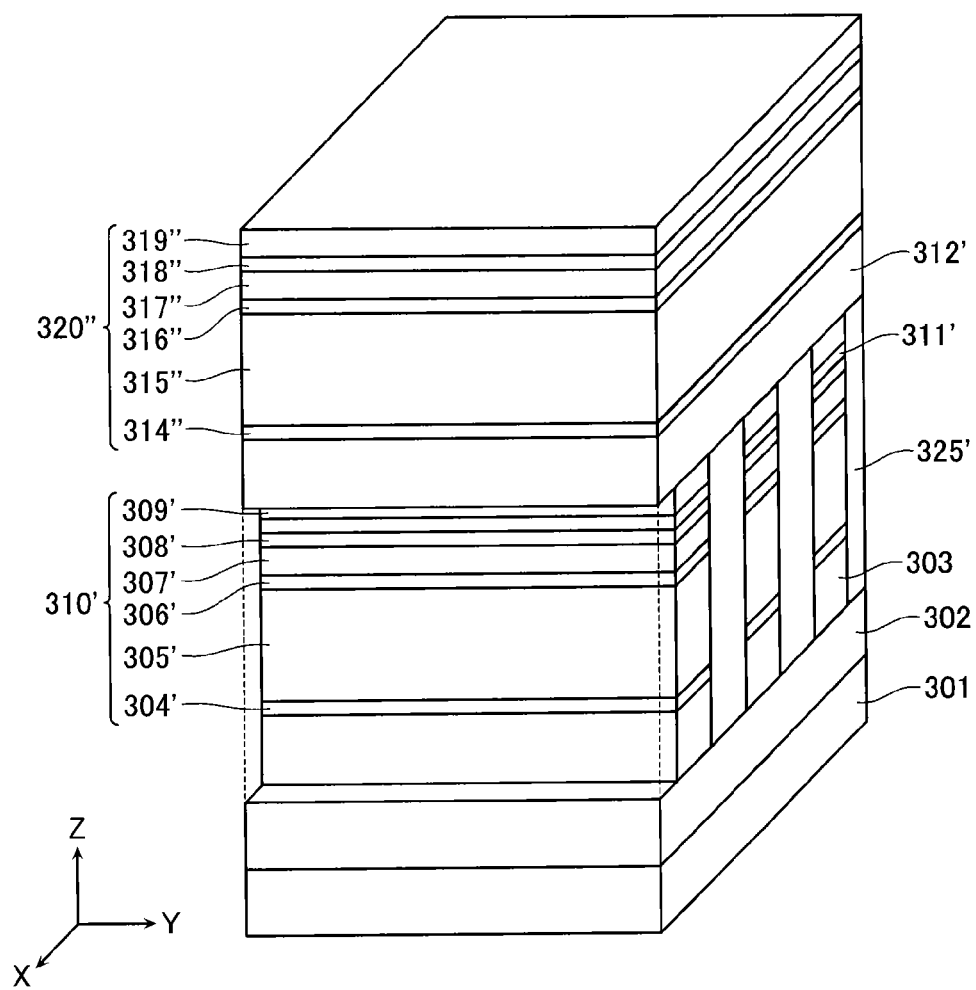

Following this, as shown in FIG. 27, an inter-layer insulating film 325' is filled into the trench 324, and then upper surfaces of the lower-side memory cell layer 310' and the inter-layer insulating film 325' are smoothed. Then, an intermediate line layer 312' which is to become the word line WL1, a layer 314" which is to become the electrode EL1, a layer 315" which is to become the non-ohmic element NO, a layer 316' which is to become the electrode EL2, a layer 317' which is to become the variable resistance element VR, a layer 318' which is to become the electrode EL3, and a layer 319" which is to become the top electrode ELT are stacked sequentially on the lower-side memory cell layer 310' and the inter-layer insulating film 325'. Of these, the layers 314"~319" configure an upper-side memory cell layer 320" which is to become the memory cell MC2.

Figure 28:
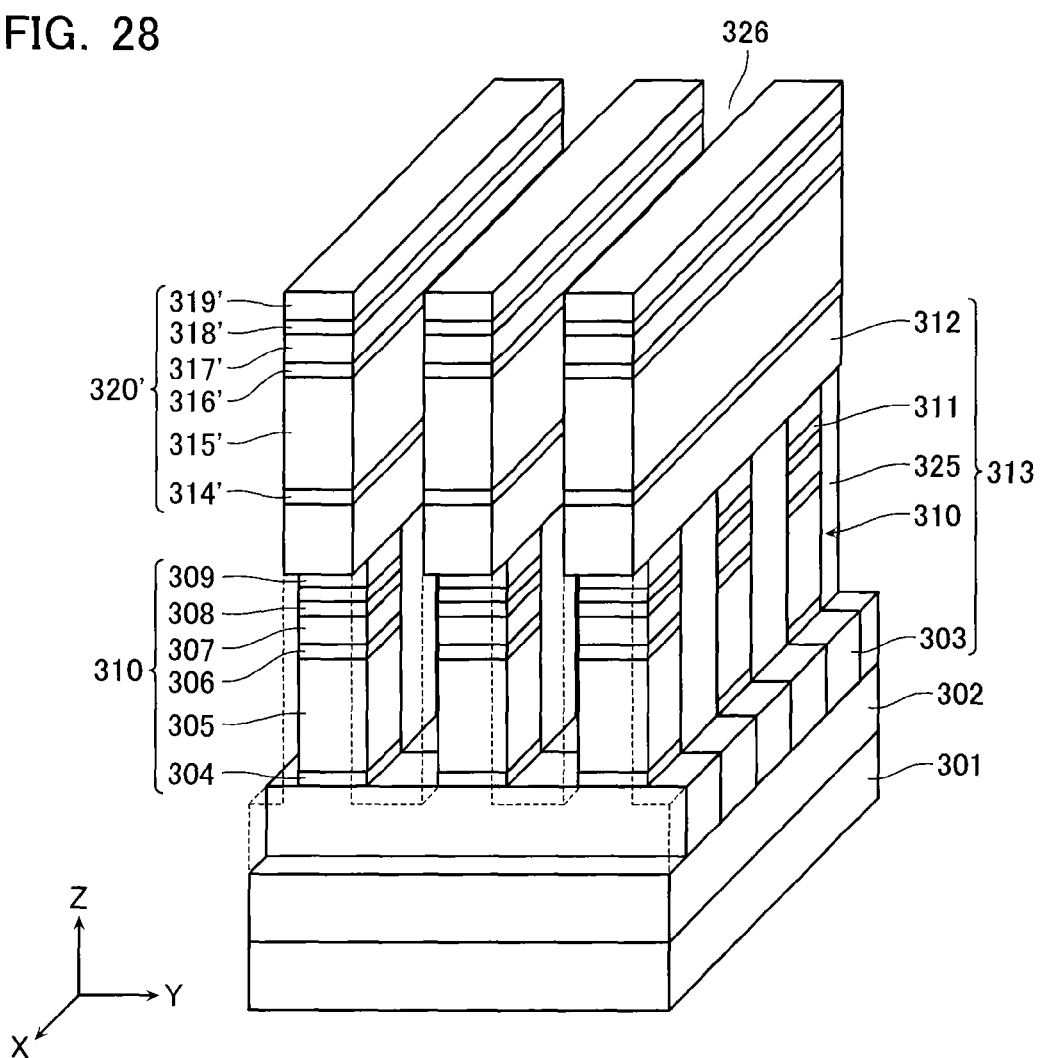

Then, as shown in FIG. 28, a plurality of trenches 326 extending in the X direction are formed in the upper-side memory cell layer 320", the intermediate line layer 312', the lower-side protective resistance layer 311', and the lower-side memory cell layer 310', until an upper surface of the lower-side line layer 303 is exposed. As a result, the lower-side memory cell layer 310', the lower-side protective resistance layer 311', the inter-layer insulating film 325', the intermediate line layer 312', and the upper-side memory cell layer 320" become lower-side memory cell layers 310, lower-side protective resistance layers 311, inter-layer insulating films 325, intermediate line layers 312, and upper-side memory cell layers 320' separated in the X direction. Moreover, the lower-side memory cell layer 310 and the intermediate line layer 312 become the memory cell MC1 and the word line WL1. The lower-side line layer 303, the lower-side memory cell layer 310, and the intermediate line layer 312 configure a memory cell array layer 313 which is the memory cell array MA1.

Figure 29:
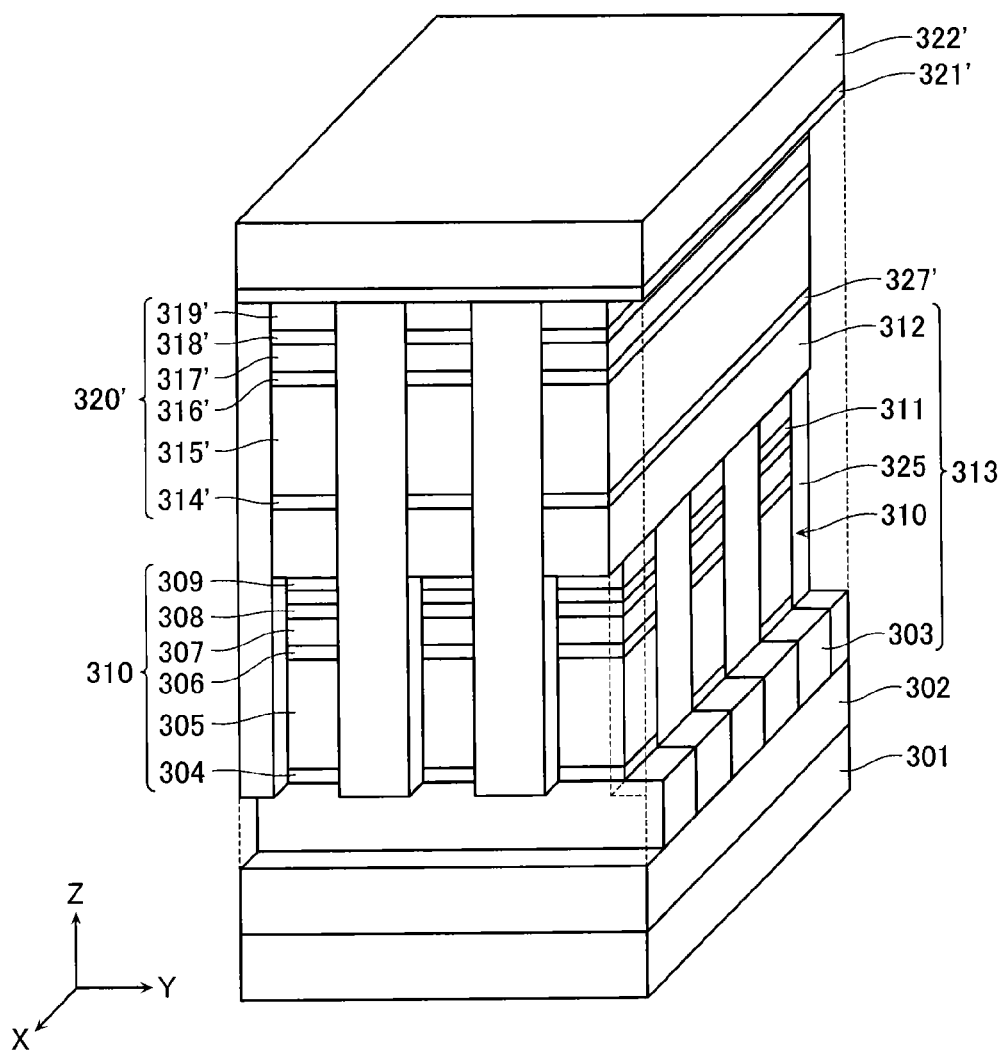

Following this, as shown in FIG. 29, an inter-layer insulating film 327' is filled into the trench 326, and then upper surfaces of the upper-side memory cell layer 320' and the inter-layer insulating film 327' are smoothed. Then, an upper-side protective resistance layer 321' which is to become the protective resistance film PR2 and an upper-side line layer 322' which is to become the bit line BL2 are stacked sequentially on the upper-side memory cell layer 320' and the inter-layer insulating film 327'.

Figure 30:
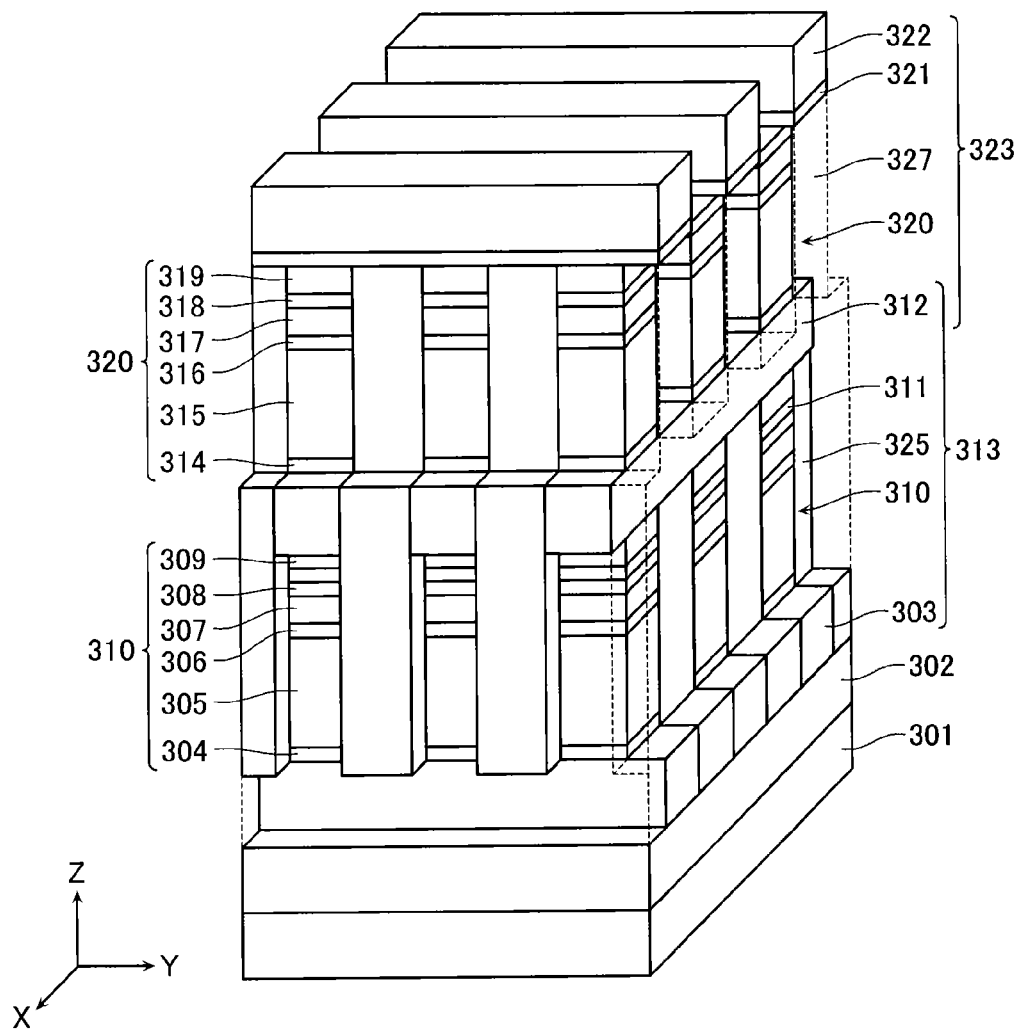

Then, as shown in FIG. 30, a plurality of trenches 328 extending in the Y direction are formed in the upper-side line layer 322', the upper-side protective resistance layer 321', the inter-layer insulating film 327', and the upper-side memory cell layer 320', until an upper surface of the intermediate line layer 312 is exposed. As a result, the upper-side memory cell layer 320', the inter-layer insulating film 327', the upper-side protective resistance layer 321', and the upper-side line layer 322' become upper-side memory cell layers 320, inter-layer insulating films 327, upper-side protective resistance layers 321, and upper-side line layers 322 separated in the Y direction. Moreover, the upper-side memory cell layer 320, the upper-side protective resistance layer 321, and the upper-side line layer 322 become the memory cell MC2, the protective resistance film PR2, and the bit line BL2. The intermediate line layer 312, the upper-side memory cell layer 320, the upper-side protective resistance layer 321, and the upper-side line layer 322 configure a memory cell array layer 323 which is the memory cell array MA2.

Then, as required, the likes of an inter-layer insulating film is filled into the trench 328, thereby allowing the memory cell block 1 shown in FIG. 23 to be manufactured.

In the case of the present embodiment, by disposing the protective resistance film PR2 between the memory cell MC2 and the bit line BL2 in the upper-side memory cell array MA2, not only can the aspect ratio when forming the trench 326 shown in FIG. 28 be made small, but also a change in properties of the upper-side protective resistance layer 321' caused during processing can be reduced, similarly to in the first embodiment. It is therefore easy to bring a resistance value of the protective resistance film PR2 after formation close to optimum.

As is clear from the above, the present embodiment makes it possible to provide a nonvolatile semiconductor memory device of low power consumption, and a method of manufacturing the same in which processing of the memory cell array is easy, similarly to in the first embodiment. Moreover, adopting the structure shown in FIG. 24 makes it possible to provide a nonvolatile semiconductor memory device of low power consumption, and a method of manufacturing the same in which processing of the memory cell array is easy, similarly to in the first embodiment, with respect to a plurality of layers of memory cell arrays MA.

Fourth Embodiment

A nonvolatile semiconductor memory device according to a fourth embodiment differs from the nonvolatile semiconductor memory device according to the third embodiment in placement of the protective resistance film in the lower-side memory cell array. Mainly, portions that differ from the third embodiment are described here.

Figure 31:
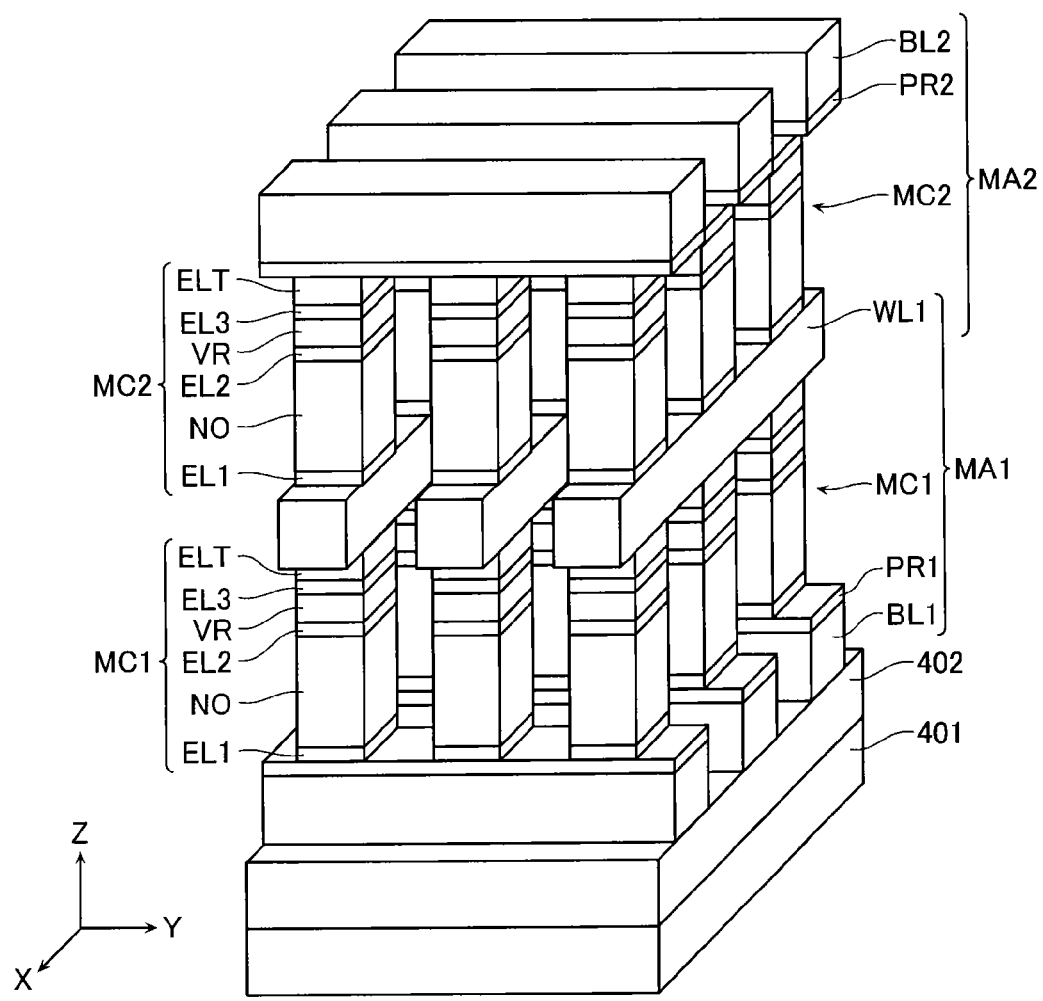
FIG. 31 is an example of a perspective view showing part of a memory cell block in a nonvolatile semiconductor memory device according to a fourth embodiment.

FIG. 31 is an example of a perspective view showing part of a memory cell block in the nonvolatile semiconductor memory device according to the fourth embodiment.

The memory cell block 1 according to the present embodiment includes a memory cell array MA1 which is a lower-side memory cell array and a memory cell array MA2 which is an upper-side memory cell array, that are stacked sequentially on an inter-layer insulating layer 402, similarly to in the third embodiment.

However, in the memory cell array MA1, contrary to in the third embodiment, the protective resistance film PR1 is disposed between the bit line BL1 and the electrode EL1 of the memory cell MC1, ohmically contacted with the memory cell MC1. Moreover, the protective resistance film PR1 provided at the intersection of a certain bit line BL1 and a certain word line WL1 and the protective resistance film PR1 provided at the intersection of said certain bit line BL1 and another word line WL1 are formed continuously in the Y direction (column direction) in which the bit line BL1 extends. In other words, in the memory cell array MA, the protective resistance film PR1 exposes only a side surface facing in the Y direction. Moreover, in the memory cell array MA, the protective resistance film PR2 exposes only a side surface facing in the X direction (row direction).

Next, FIGS. 32~35 are examples of perspective views showing manufacturing processes of the memory cell block in the nonvolatile semiconductor memory device according to the present embodiment, in order of process.

Figure 32:
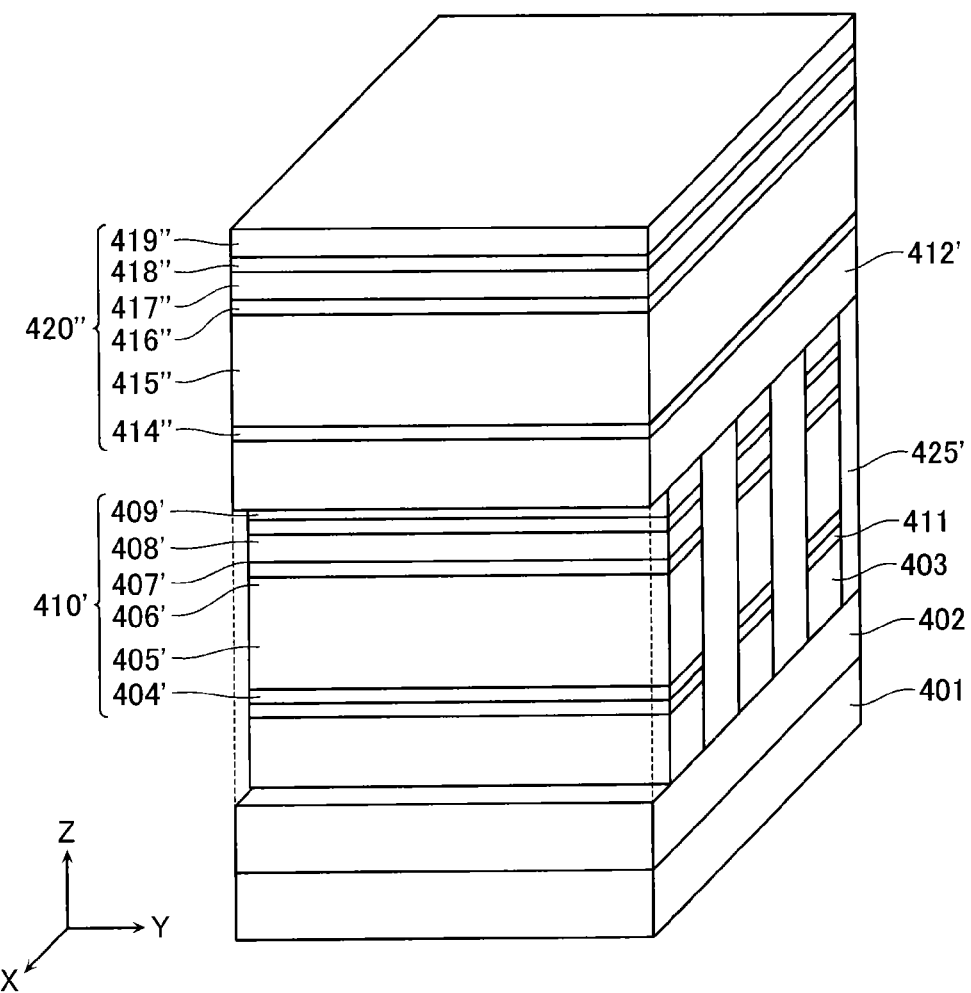
FIGS. 32~35 are examples of perspective views showing manufacturing processes of the memory cell block in the nonvolatile semiconductor memory device according to the same embodiment, in order of process.

First, as shown in FIG. 32, a structure configured from a semiconductor substrate 401 through an intermediate line layer 412' is formed by processes similar to those shown in FIGS. 17~19 of the second embodiment. Of these, layers 404'409' configure a lower-side memory cell layer 410' which is to become the memory cell MC1. Then, a layer 414" which is to become the electrode EL1, a layer 415" which is to become the non-ohmic element NO, a layer 416" which is to become the electrode EL2, a layer 417" which is to become the variable resistance element VR, a layer 418" which is to become the electrode EL3, and a layer 419" which is to become the top electrode ELT are stacked sequentially on the intermediate line layer 412'. Of these, the layers 414"~419" configure an upper-side memory cell layer 420" which is to become the memory cell MC2.

Figure 33:
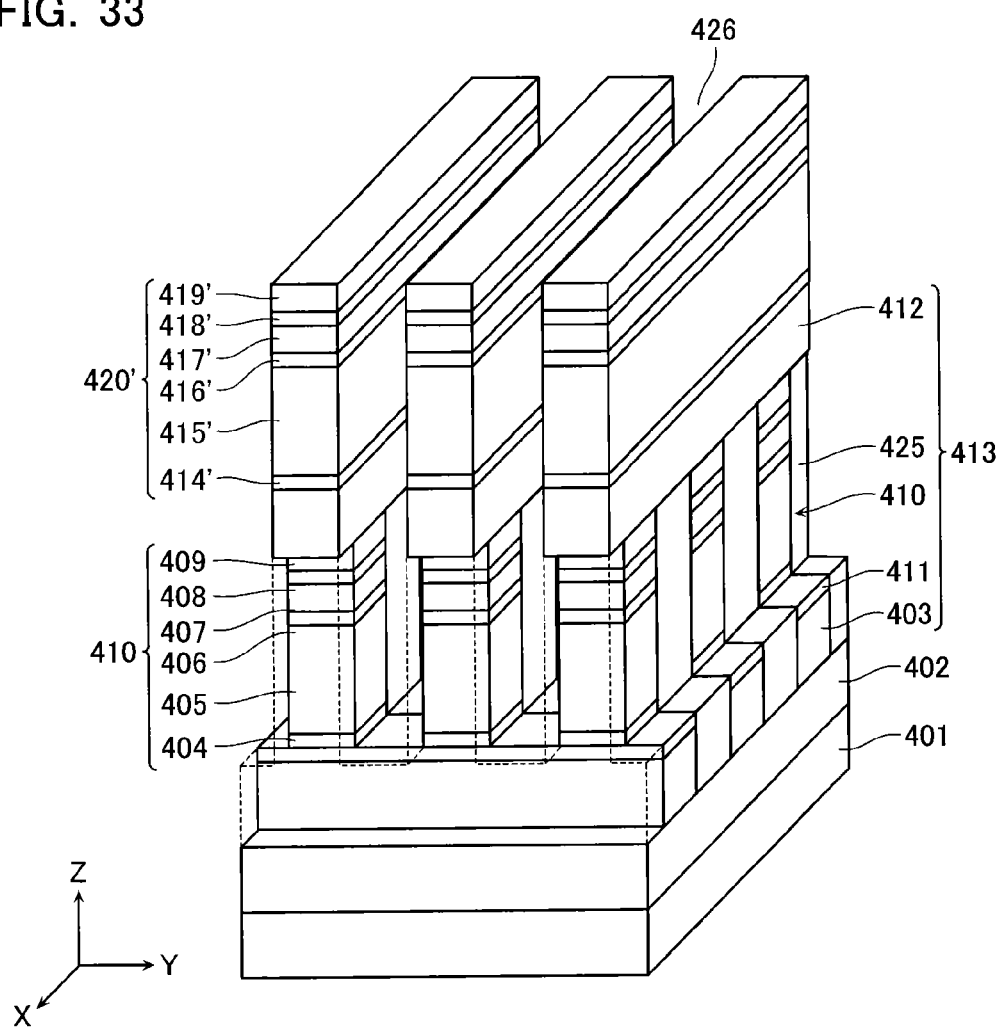

Then, as shown in FIG. 33, a plurality of trenches 426 extending in the X direction are formed in the upper-side memory cell layer 420", the intermediate line layer 412', an inter-layer insulating film 425', and the lower-side memory cell layer 410', until an upper surface of a lower-side protective resistance layer 411 is exposed. As a result, the lower-side memory cell layer 410', the inter-layer insulating film 425', the intermediate line layer 412', and the upper-side memory cell layer 420" become lower-side memory cell layers 410, inter-layer insulating films 425, intermediate line layers 412, and upper-side memory cell layers 420' separated in the X direction. Moreover, the lower-side memory cell layer 410 and the intermediate line layer 412 become the memory cell MC1 and the word line WL1. The lower-side line layer 403, the lower-side memory cell layer 410, and the intermediate line layer 412 configure a memory cell array layer 413 which is the memory cell array MA1.

Figure 34:
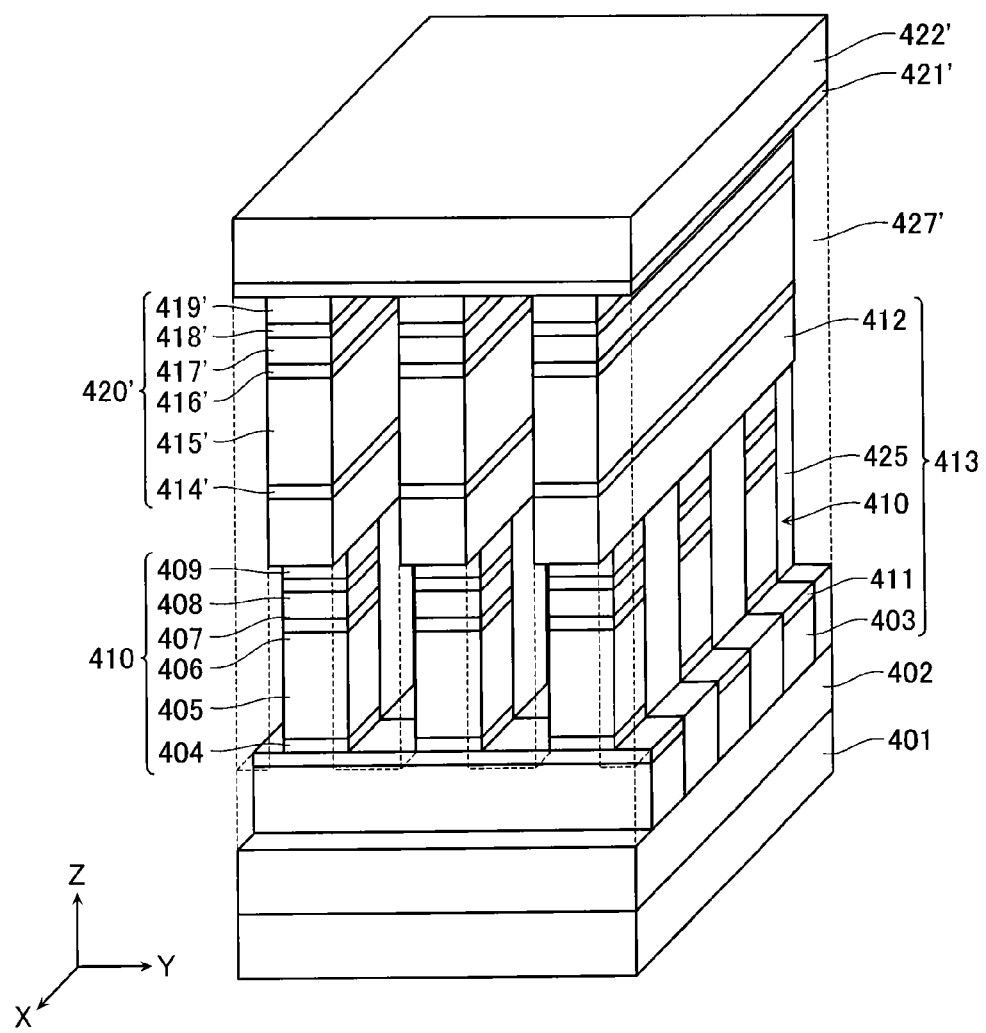

Following this, as shown in FIG. 34, an inter-layer insulating film 427' is filled into the trench 426, and then upper surfaces of the upper-side memory cell layer 420' and the inter-layer insulating film 427' are smoothed. Then, an upper-side protective resistance layer 421' which is to become the protective resistance film PR2 and an upper-side line layer 422' which is to become the bit line BL2 are stacked sequentially on the upper-side memory cell layer 420' and the inter-layer insulating film 427'.

Figure 35:
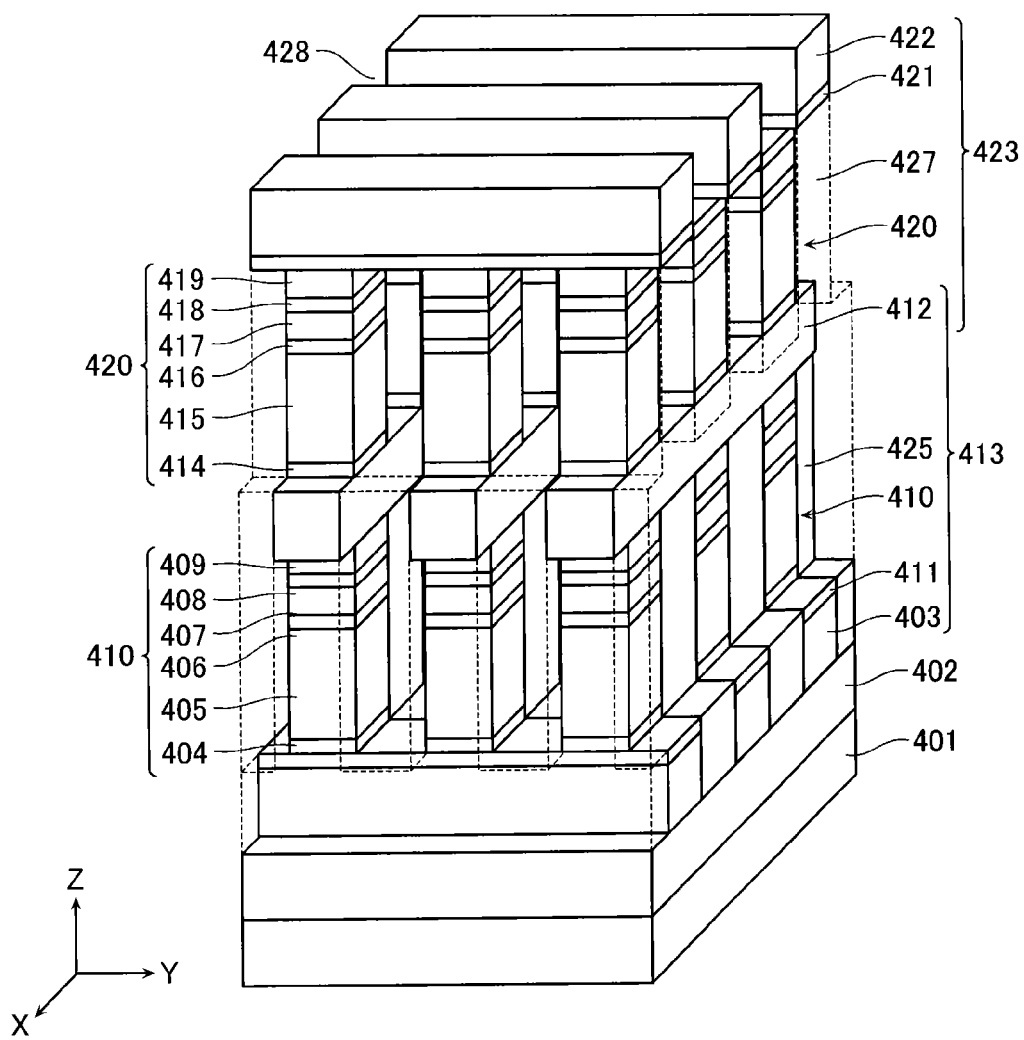

Then, as shown in FIG. 35, a plurality of trenches 428 extending in the Y direction are formed in the upper-side line layer 422', the upper-side protective resistance layer 421', the inter-layer insulating film 427', and the upper-side memory cell layer 420', until an upper surface of the intermediate line layer 412 is exposed. As a result, the upper-side memory cell layer 420', the inter-layer insulating film 427', the upper-side protective resistance layer 421', and the upper-sideline layer 422' become upper-side memory cell layers 420, inter-layer insulating films 427, upper-side protective resistance layers 421, and upper-side line layers 422 separated in the Y direction. Moreover, the upper-side memory cell layer 420, the upper-side protective resistance layer 421, and the upper-side line layer 422 become the memory cell MC2, the protective resistance film PR2, and the bit line BL2. The intermediate line layer 412, the upper-side memory cell layer 420, the upper-side protective resistance layer 421, and the upper-side line layer 422 configure a memory cell array layer 423 which is the memory cell array MA2.

Then, as required, the likes of an inter-layer insulating film is filled into the trench 428, thereby allowing the memory cell block 1 shown in FIG. 31 to be manufactured.

In the case of the present embodiment, by disposing the protective resistance film PR1 between the bit line BL1 and the memory cell MC1 in the lower-side memory cell array MA1, not only can the aspect ratio when forming the trench 426 shown in FIG. 33 be made even smaller compared to in the third embodiment, but also a change in properties of a protective resistance layer 411' caused during processing can be reduced more compared to in the third embodiment.

Figure 38:
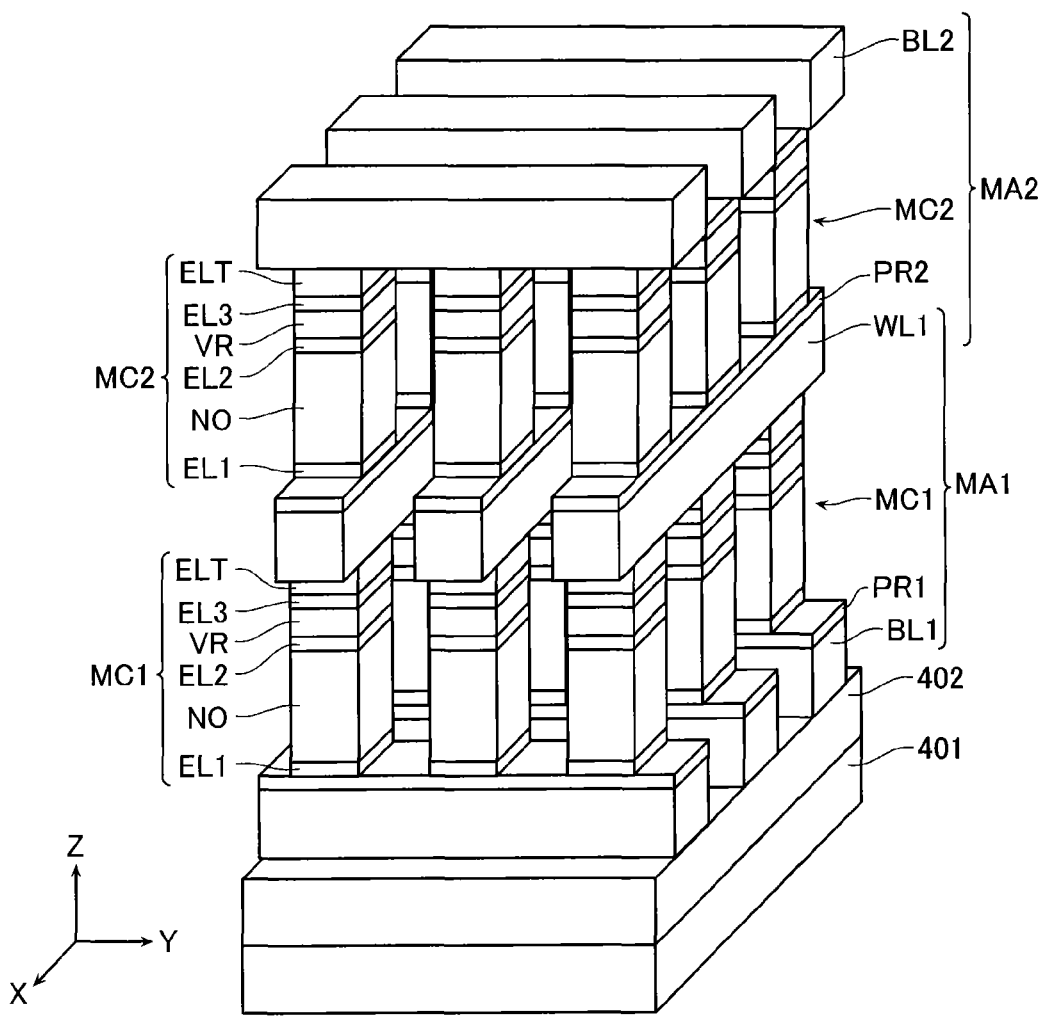
FIG. 38 is an example of a perspective view showing part of a memory cell block in a nonvolatile semiconductor memory device according to the fourth embodiment.

Furthermore, it may be modification as shown in FIG. 38. The protective resistance film PR1 is disposed between the bit line BL1 and the electrode EL1 of the memory cell MC1, ohmically contacted with the memory cell MC1. Moreover, the protective resistance film PR2 is disposed between the word line WL1 and the electrode EL1 of the memory cell MC2, ohmically contacted with the memory cell MC2.

As is clear from the above, the present embodiment makes it possible to provide a nonvolatile semiconductor memory device of low power consumption, and a method of manufacturing the same in which processing of the memory cell array is even easier compared to in the third embodiment.

Other

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
  a memory cell array including: a plurality of first lines; a plurality of second lines; and a plurality of memory cells disposed at intersections of the first lines and the second lines and having a variable resistance element, the memory cell array further including a protective resistance film, the protective resistance film being disposed at the intersections of the first lines and the second lines, being disposed between the memory cells and the second lines, being continuously disposed along the second lines in an extending direction of the second lines, being connected in series with the memory cells and ohmically contacting the memory cells, and being configured from a material having a resistivity of 1~100 Ω·cm.

2. The nonvolatile semiconductor memory device according to claim 1, wherein the first lines and the second lines are configured from a material having a resistivity of 0.1~100 μΩ·cm.

3. The nonvolatile semiconductor memory device according to claim 1, wherein the protective resistance film adopts, as a material thereof, SiN, TaN, TiON, HfN, ZrN, AlN, TiSiN, TaSiN, HfSiN, AlSiN, ZrSiN, TiAlN, or doped poly silicon.

4. The nonvolatile semiconductor memory device according to claim 1, wherein a resistance value of the protective resistance film is based on the number of the memory cells simultaneously accessed.

5. The nonvolatile semiconductor memory device according to claim 1, wherein the protective resistance film directly contacts one of the second lines.

6. The nonvolatile semiconductor memory device according to claim 1, wherein the memory cells include electrodes disposed at a side of the second lines, and the protective resistance film ohmically contacts the electrodes.

7. The nonvolatile semiconductor memory device according to claim 6, wherein the electrodes are configured from a material including TiN.

8. A nonvolatile semiconductor memory device, comprising:

a memory cell block configured having a first memory cell array and a second memory cell array stacked therein, the first memory cell array including: a plurality of first lines; a plurality of second lines; and a plurality of first memory cells disposed at intersections of the first lines and the second lines and having a variable resistance element, and the second memory cell array sharing the second lines with the first memory cell array and including: a plurality of third lines extending in the same direction as the first lines; and a plurality of second memory cells disposed at intersections of the second lines and the third lines and having a variable resistance element, the first memory cell array further including a first protective resistance film, the first protective resistance film being disposed at the intersections of the first lines and the second lines, being disposed between the first memory cells and the second lines, and being continuously disposed along the second lines in an extending direction of the second lines, and the second memory cell array further including a second protective resistance film, the second protective resistance film being disposed at the intersections of the second lines and the third lines, being disposed between the second memory cells and the third lines, and being continuously disposed along the third lines in an extending direction of the third lines.

9. The nonvolatile semiconductor memory device according to claim 8, wherein the first memory cells include first electrodes disposed at a side of the second lines, and the first protective resistance film ohmically contacts the first electrodes.

10. The nonvolatile semiconductor memory device according to claim 8, wherein the second memory cells include second electrodes disposed at a side of the third lines, and the second protective resistance film ohmically contacts the second electrodes.

11. The nonvolatile semiconductor memory device according to claim 8, wherein the first protective resistance film and the second protective resistance film are configured from a material having a resistivity of 1~100 Ω·cm.

12. The nonvolatile semiconductor memory device according to claim 8, wherein the first lines, the second lines, and the third lines are configured from a material having a resistivity of 0.1~100 Ω·cm.

13. The nonvolatile semiconductor memory device according to claim 8, wherein the first protective resistance film and the second protective resistance film adopt, as a material thereof, SiN, TaN, TiON, HfN, ZrN, AlN, TiSiN, TaSiN, HfSiN, AlSiN, ZrSiN, TiAlN, TaAlN, or doped poly silicon.

14. The nonvolatile semiconductor memory device according to claim 1, wherein the protective resistance film has a step provided between the memory cells, and a depth of the step is less than or equal to a depth of a step provided at a hook-up portion of the second lines positioned outside of a placement region of the memory cells.

15. The nonvolatile semiconductor memory device according to claim 14, wherein the memory cells include electrodes disposed at a side of the second lines, and the protective resistance film ohmically contacts the electrodes.

16. The nonvolatile semiconductor memory device according to claim 14, wherein the protective resistance film directly contacts one of the second lines.

\* \* \* \* \*